US00RE37359B1

(19) United States
(12) Reissued Patent
Wakamoto et al.

(10) Patent Number: US RE37,359 E
(45) Date of Reissued Patent: Sep. 11, 2001

(54) PROJECTION EXPOSURE METHOD AND APPARATUS CAPABLE OF PERFORMING FOCUS DETECTION WITH HIGH ACCURACY

(75) Inventors: Shinji Wakamoto, Tokyo; Yuji Imai, Ohmiya, both of (JP)

(73) Assignee: Nikon Corporation, Tokyo (JP)

(21) Appl. No.: 09/326,220

(22) Filed: Jun. 3, 1999

Related U.S. Patent Documents

Reissue of:
(64) Patent No.: 5,635,722
Issued: Jun. 3, 1997
Appl. No.: 08/521,415
Filed: Aug. 30, 1995

U.S. Applications:
(63) Continuation-in-part of application No. 08/269,116, filed on Jun. 30, 1994, now abandoned.

(30) Foreign Application Priority Data

Jul. 1, 1993 (JP) ..... 5-163681
Jun. 23, 1994 (JP) ..... 6-141323
Dec. 9, 1994 (JP) ..... 6-305925

(51) Int. Cl.[7] ..... G01N 21/86
(52) U.S. Cl. ..... 250/548; 250/559.3; 356/400
(58) Field of Search ..... 250/548, 559.3, 250/559.29, 559.22; 356/399–401; 355/43–45, 53–55

(56) References Cited

U.S. PATENT DOCUMENTS 4,558,949 * 12/1985 Uehara et al. ..... 356/375
4,650,983 * 3/1987 Suwa ..... 250/548
4,780,617 * 10/1988 Umatate et al. ..... 250/548
4,833,621 * 5/1989 Umatate ..... 364/491
4,853,745 * 8/1989 Kamiya et al. ..... 355/43
4,952,815 * 8/1990 Nishi ..... 250/548
4,952,970 * 8/1990 Suzuki et al. ..... 355/55
5,015,866 * 5/1991 Hayashi ..... 250/548
5,241,188 * 8/1993 Mizutani ..... 250/548

* cited by examiner

*Primary Examiner*—Que T. Le
(74) *Attorney, Agent, or Firm*—Miles & Stockbridge P.C.

(57) ABSTRACT

A projection exposure apparatus comprises a projection optical system for projecting a pattern of a mask on a photosensitive substrate, a stage, for holding the photosensitive substrate, movable in an optical-axis direction of the projection optical system and in a direction perpendicular to the optical axis, a position detection system for outputting a detection signal corresponding to a deviation of the projection optical system in the optical-axis direction between an imaging plane of the projection optical system and the surface of the photosensitive substrate by projecting a beam of light assuming a predetermined shape on the photosensitive substrate and, at the same time, photoelectrically detecting the reflected light from the photosensitive substrate, a fiducial member provided on the stage and having a fiducial pattern assuming a predetermined shape, and a device for detecting an irradiation position of the light beam within a plane perpendicular to the optical axis of the projection optical system on the basis of variations in intensity of a detection signal outputted from the position detection system when the fiducial pattern and the light beam are relatively moved in the predetermined direction perpendicular to the optical axis of the projection optical system.

68 Claims, 13 Drawing Sheets

PROJECTION EXPOSURE METHOD AND APPARATUS CAPABLE OF PERFORMING FOCUS DETECTION WITH HIGH ACCURACY

Matter enclosed in heavy brackets [ ] appears in the original patent but forms no part of this reissue specification; matter printed in italics indicates the additions made by reissue.

This application is a continuation-in-part of U.S. patent application Ser. No. 08/269,116, filed Jun. 30, 1994, abandoned.

BACKGROUND OF THE INVENTION

1. Field of the Invention

The present invention relates generally to a projection exposure apparatus and method employed in a photolithography process of manufacturing a semiconductor element and a liquid crystal display element, etc. and, more particularly, to a projection exposure apparatus and method capable of focusing on a photosensitive substrate.

2. Related Background Art

In a conventional projection exposure apparatus, when imaging a pattern of a mask (reticle) on a photosensitive substrate (wafer) through a projection optical system, it is indispensible to align a wafer surface with a pattern imaging plane, i.e., to perform focusing. In recent years, a focal depth of the projection optical system has become smaller. On the other hand, even an apparatus using t-line of a wavelength of 365 nm for an exposure illumination can obtain only a focal depth on the order of ±0.7 μm. This is the real situation. Accordingly, a focus detection system incorporated in this type of projection exposure apparatus is required to highly accurately detect a deviation quantity between the imaging plane of the projection optical system and the wafer surface in an optical-axis direction of the projection optical system.

As described above, a technique disclosed in, e.g., U.S. Pat. No. 4,558,949, is known as a method of performing the focusing by detecting the deviation quantity between the imaging plane of the projection optical system and the wafer surface in the optical-axis direction of the projection optical system with the high accuracy. According to this method, the wafer is irradiated with a laser beam (non-photosensitive to a resist on the wafer) in the form of a pattern image. The light beam reflected therefrom is photoelectrically detected by a synchronous detection method. Then, there is highly accurately detected the deviation quantity between the imaging plane of the projection optical system and the wafer surface in the optical-axis direction of the projection optical system.

Herein, it is assumed that the optical-axis direction of the projection optical system is termed a Z-direction, and a coordinate system for prescribing a moving position of a stage within a plane perpendicular to the Z-direction is termed an XY-coordinate system. When detecting a height position of the wafer surface, an image forming position (an XY-coordinate position) of a pattern image (hereinafter referred to as a slit image) projected on the wafer by the focus detection system is previously adjusted, wherein a position of the optical axis of the projection optical system is a set position within the imaging plane of the projection optical system. Hence, the focus detection system detects the focal point by projecting the slit image on a point-of-center of each shot area which has already been exposed on the wafer.

In the conventional projection exposure apparatus, however, the slit image is adjusted to fall within a predetermined allowable range in which the above set position on the imaging plane of the projection optical system is centered. Accordingly, there is a scatter in terms of the coordinate position in which the slit image is actually formed on the imaging plane of the projection optical system according to each projection exposure apparatus.

In general, the surface of each shot area exposed on the wafer is formed with a stepped portion (a ruggedness) through an exposure process. A scribe line may be exemplified as this ruggedness. When forming two circuit patterns within one shot area, this implies a formation of a groove existing between these two circuit pattern areas. A groove width is approximately 2 mm, and a groove step is on the order of 1–5 μm.

In the case of effecting the focus detection by making the slit image fall on the above shot area, the above-mentioned conventional apparatus can use the following techniques; the slit image is made to fall on the point-of-center of the shot area, i.e., on the scribe line; and the slit image is made to fall on a position off the point-of-center of the shot area, i.e., not on the scribe line but on the circuit pattern area. A height difference as large as 5 μm at the maximum is produced in the focus detection, depending on the apparatus. In such an exposure apparatus, it is difficult to dispose the wafer surface within a focal depth as small as ±0.7 μm. Further, a micro stepped portion exists even in the shot area with no scribe line, and this also exerts a large influence on the focus detection.

Further, in the conventional projection exposure apparatus, there is a scatter in terms of the imaging status (in-focus status) of the slit image on the wafer according to each projection exposure apparatus, and the focal point of the slit image is not always the most appropriate on the wafer. There is a problem that an out-of-focus state of this slit image causes an error in focus detection.

SUMMARY OF THE INVENTION

It is an object of the present invention to provide a projection exposure method and apparatus capable of performing a focus detection with high accuracy all the time even when a rugged portion exists on a substrate.

It is another object of the present invention to provide a projection exposure method and apparatus capable of making a focal point of a slit image incident on the substrate most appropriate so as to perform focus detection with a high accuracy all the time.

One embodiment of the present invention will be explained in conjunction with FIG. 1.

According to one aspect of the present invention, there is provided a projection exposure apparatus comprising:

(a) a projection optical system (PL) for projecting a pattern of a mask on a photosensitive substrate;

(b) a stage (ST), for holding the photosensitive substrate, movable in an optical-axis direction of the projection optical system and in a direction perpendicular to the optical axis;

(c) a position detection system (15–21) for outputting a detection signal corresponding to a deviation of the projection optical system in the optical-axis direction between an imaging plane of the projection optical system and the surface of the photosensitive substrate by projecting a beam of light assuming a predetermined shape on the photosensitive substrate and, at the same time, photoelectrically detecting the reflected light from the photosensitive substrate;

(d) a fiducial member (FM) provided on the stage and having a fiducial pattern assuming a predetermined shape; and (e) a device (103, MCS) for detecting an irradiation position of the light beam within a plane perpendicular to the optical axis of the projection optical system on the basis of variation in intensity of a detection signal outputted from the position detection system when the fiducial pattern and the light beam are relatively moved in the predetermined direction perpendicular to the optical axis of the projection optical system.

According to another aspect of the present invention, there is provided a method of obtaining a photoelectric signal corresponding to a deviation in an optical-axis direction of a projection optical system between an imaging plane of the projection optical system and the surface of a photosensitive substrate and disposing the surface of the photosensitive substrate on the imaging plane on the basis of the photoelectric signal by projecting a light beam assuming a predetermined shape on the photosensitive substrate prior to transferring an image of a pattern of a mask onto the photosensitive substrate through the projection optical system and, at the same time, photoelectrically detecting the reflected light from the photosensitive substrate, the method comprising:

(a) a step of detecting an irradiation position of the light beam on a static coordinate system for prescribing a moving position of the photosensitive substrate on the basis of the photoelectric signal obtained when irradiating a fiducial pattern assuming a predetermined shape with the light beam; and (b) a step of relatively moving the light beam and the photosensitive substrate in accordance with the detected irradiation position to project the light beam on a predetermined measuring point on the photosensitive substrate.

According to the present invention, a image forming position of the pattern image (SP) projected on the substrate by the focus detection system is obtained by effecting a relative scan with respect to the mark including two areas having different reflectivities. Obtained subsequently is a positional deviation from the position of the optical axis (AX) of the projection optical system. Based on this positional deviation, the moving device moves at least one of the slit image and the substrate, thereby aligning a measuring point on the substrate with the image forming position of the slit image. With this processing, the focus detection system can detect the focal point by making the slit image fall on a predetermined measuring point (e.g., the point-of-center of the shot area) at all times. Accordingly, even if the rugged portion exists in the shot area, the focus detection can be always effected with the high accuracy.

According to one aspect of the present invention, there is provided a projection exposure apparatus comprising:

a projection optical system (PL) for projecting an image of a pattern of a mask on a photosensitive substrate;

a stage (ST), for holding the photosensitive substrate, movable in an optical-axis direction of a projection optical system and in a direction perpendicular to the optical axis;

a position detection system (15–21) for outputting a detection signal corresponding to a deviation of the projection optical system in the optical-axis direction between an imaging plane of the projection optical system and the surface of the photosensitive substrate by projecting the pattern image (SP) on the photosensitive substrate and, at the same time, photoelectrically detecting the reflected light from the photosensitive substrate;

a light-receiving device (81) having a light-receiving plane provided on a part of the stage;

a detection system (20, MCS) for detecting an imaging status of the pattern image (SP) on the light-receiving plane on the basis of a photoelectric signal output from the light-receiving device when the pattern image (SP) is projected on the light-receiving plane; and an adjustment system (18c, 17) for adjusting a focal point of the pattern image (SP) on the basis of the imaging status of the pattern image detected by the detection system.

In the above-mentioned projection optical exposure apparatus, the position detection system preferably comprises a projection system for projecting the pattern image on the substrate, and the adjustment system preferably comprises a driving member for driving at least one of a plurality of optical elements for constituting said projection system in the optical-axis direction of the projection system. It is also preferable that the light-receiving device comprises an image pick-up element for picking up the pattern image.

According to another aspect of the present invention, there is provided a method of obtaining a photoelectric signal corresponding to a deviation in an optical-axis direction of a projection optical system between an imaging plane of the projection optical system and the surface of a photosensitive substrate on the imaging plane on the basis of said detection signal by projecting an image of a pattern on the photosensitive substrate prior to transferring the image of the pattern onto the photosensitive substrate through the projection optical system and, at the same time, photoelectrically detecting the reflected light from the photosensitive substrate, the method comprising:

a step of detecting an imaging status of the pattern image by photoelectrically detecting the pattern image (SP) incident on a stage or the reflected light from the stage; and a step for adjusting a focal point of the pattern image (SP) on the photosensitive substrate on the basis of the detected imaging status of the pattern image.

According to the present invention, the imaging status of the pattern image is obtained by the detection system on the basis of an output signal from the light-receiving device when the pattern image (SP) is photoelectrically detected on the light-receiving plane on the stage. The adjustment system serves to adjust the imaging status of the pattern image in such a manner that the focal point of the pattern image on the light-receiving plane is most appropriate. Therefore, the focus detection can be performed with high accuracy all the time and scattered detection errors, depending on each apparatus, can be removed.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
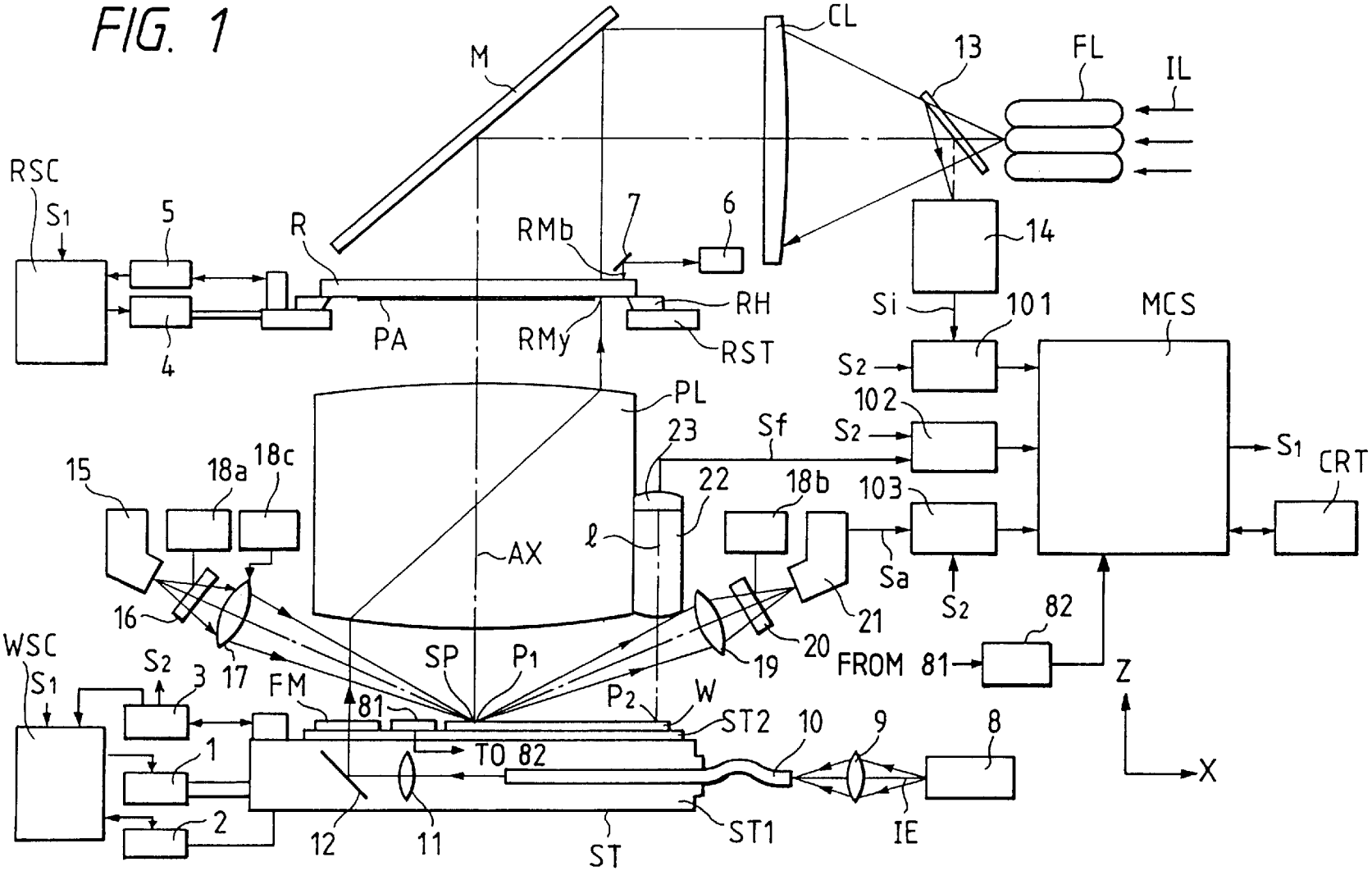
FIG. 1 is a view schematically illustrating a construction of a projection exposure apparatus in an embodiment of the present invention.

FIG. 1 is a view schematically illustrating configurations of a projection exposure apparatus in one embodiment of the present invention and of a focus detecting system incorporated therein. An explanation will be given hereinbelow with reference to FIG. 1.

A beam of illumination light (g- and i-lines from a memory lamp, or an ultraviolet pulse ray from an excimer laser light source) IL passes through a fly-eye lens FL. Thereafter, the illumination light beam IL falls on a pattern area PA of a reticle R with a uniform illuminance via a condenser lens CL and a mirror M as well. The illumination light beam IL penetrating the pattern area PA then reaches a wafer W placed on a wafer stage ST through a projection optical system (which is telecentric on both sides in FIG. 1 but may also be telecentric on one side). The wafer state ST is constructed of an XY stage ST1 and a Z stage ST2. Then, the XY stage ST1 is movable by an XY drive system 1 in a direction perpendicular to an optical axis AX of the projection optical system PL. The Z stage ST2 is movable by a Z drive system 2 in a direction (a Z-axis direction) along the optical axis AX of the projection optical system PL. A position (an XY-coordinate value) of the XY stage ST1 is sequentially measured by a stage interferometer 3. A position (a Z coordinate value) of the Z stage ST2 in the Z-axis direction is obtained by an encoder provided in the Z stage drive system 2. A wafer stage controller WSC controls movements and locating the XY stage ST1 and the Z stage ST2 through the XY drive system 1 and the Z drive system 2. These operations are performed based on the XY-coordinate values given from the state interferometer 3, the Z-coordinate values given from the Z drive system 2 and commands issued from a main control system MCS.

The reticle R is held by a reticle holder RH. The reticle holder RH is mounted on the reticle stage RST. The reticle stage RST is by a reticle drive system 4 in the XY direction. A coordinate value of the reticle R is sequentially measured by a reticle interferometer 5. A reticle stage controller RSC controls a movement and locating of the reticle stage RST through the reticle drive system 4 on the basis of coordinate values given from the reticle interferometer 5 and commands issued from the main control system MCS.

Figure 2:
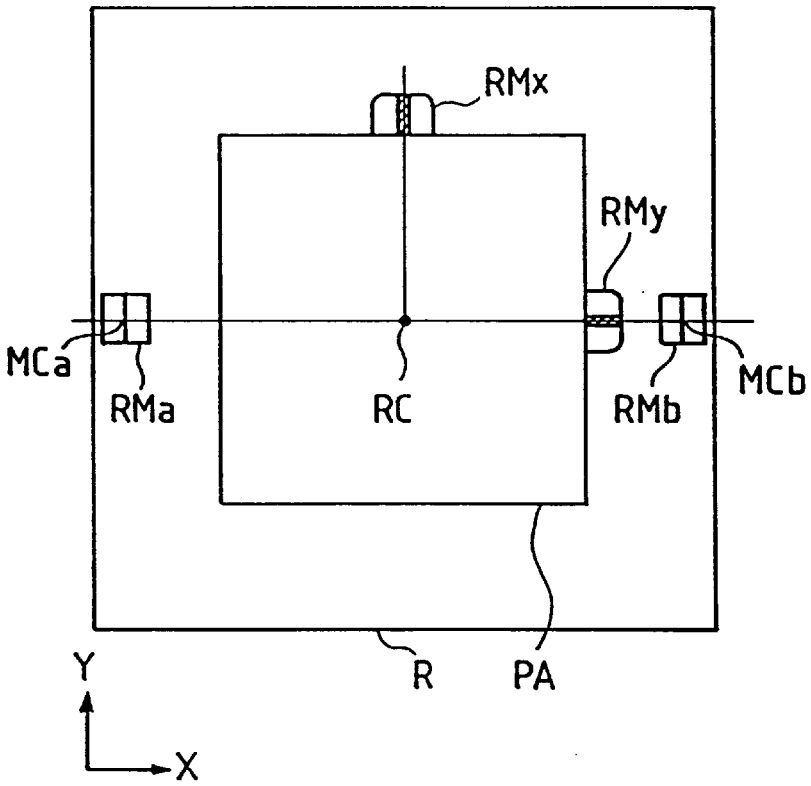
FIG. 2 is a view showing a layout of marks on a reticle R.

FIG. 2 is a view of the reticle R as viewed from the side of a mirror M (an upper side in FIG. 1). The internal circuit pattern PA of the reticle R is formed with a circuit pattern for manufacturing a semiconductor element. The pattern area PA is substantially a square. Alignment marks RMx, RMy are formed outwardly (of the pattern area) of two sides, adjacent to each other, of this square so as to be contiguous to the pattern area PA. The alignment mark RMx has a rectangular mark portion extending in the X-direction. The alignment mark RMy has a rectangular mark portion extending in the Y-direction. Then, openings are formed in both sides (in the direction perpendicular to the longitudinal direction of each mark portion) of each mark portion. Then, a point-of-center (a point-of-center of the pattern area) RC of the reticle R exists on a line of extension of the central line in the longitudinal direction of each mark. These alignment marks RMx, RMy are employed for measuring a position of the reticle R, and a detailed discussion on this matter will be given hereinbelow.

Further, as illustrated in FIG. 2, the reticle R is provided with reticle marks RMa, RMb formed adjacent to two sides (two sides parallel to the Y-direction in FIG. 2), disposed in face-to-face relationship, of the outer periphery (square) of the reticle R. The reticle marks RMa, RMb have mark portions each assuming a cross extending in the X- and Y-directions. Each of points-of-center MCa, MCb of the respective mark portions exists on a straight line passing through the point-of-center RC of the reticle R and extending in the X-direction. These reticle marks RMa, RMb are read by a reticle alignment system, which will be mentioned later, when locating the reticle R in a predetermined position.

Now, referring back to FIG. 1, the reticle alignment system (6, 7) consisting of a mark detection system 6 and a mirror 7 is provided above the reticle R. This reticle alignment system (6, 7) detects the reticle mark RMb shown in FIG. 2. Further, the projection exposure apparatus in this embodiment incorporates an (unillustrated) alignment system, constructed the same as the reticle alignment system (6, 7), for detecting the reticle mark RMa. The reticle alignment system (6, 7) detects, when the reticle mark RMb is irradiated with a laser beam of, e.g., a He-Ne laser or the like, a beam of light reflected therefrom. The main control system MCS controls the position of the reticle R through the reticle stage controller RSC so that an image of the reticle mark RMb is aligned with an index in the mark detection system 6. The reticle mark RMa is also detected by the unillustrated alignment system in the same manner. The reticle R is located by these reticle alignment systems so that the point-of-center RC is aligned with the optical axis AX.

Figure 3:
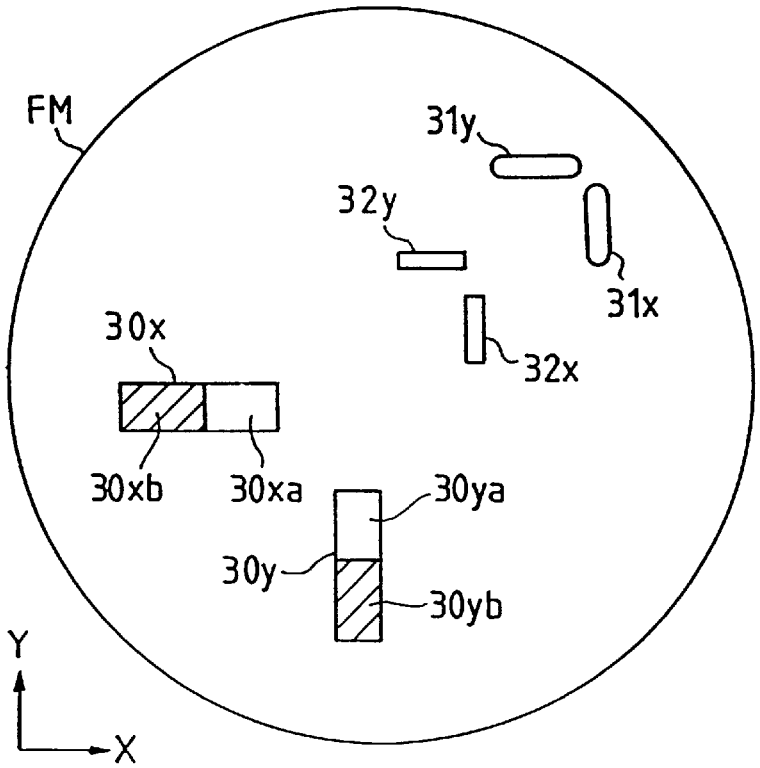
FIG. 3 is a view showing a layout of marks formed on a fiducial plate FM.

Moreover, a fiducial plate FM is provided on the stage ST (the Z stage ST2 in FIG. 1). The surface of this fiducial plate FM and the surface of the wafer W exist within substantially the same plane. FIG. 3 is a view of the fiducial plate FM as viewed from the side of the projection optical system (an upper side in FIG. 1). Referring to FIG. 3, the fiducial plate FM is formed with rectangular patterns (fiducial marks) 30x, 30y, the longitudinal directions of which are the X- and Y-directions. Formed also on the fiducial plate FM are luminescent marks 31x, 31y each bearing a light transmitting property and marks 32x, 32y for a baseline measurement, which will be stated later. The, fiducial mark 30x is composed of a high-reflection area 30xa and a low-reflection area 30xb. The fiducial mark 30y is also composed of a high-reflection area 30ya and a low-reflection area 30yb. These marks 30x, 30y, 31x, 31y, 32x, 32y are disposed in predetermined positions on the fiducial plate FM. The main control system MCS previously memorizes distances (intervals between points-of-center of the respective marks) between the respective marks.

Given next are explanations about an illumination system for irradiating the luminescent marks 31x, 31y provided on the fiducial plate FM with the light from the side opposite (from the lower side in FIG. 1) to the projection optical system PL with respect to this fiducial plate FM and about a light receiving system for receiving the light penetrating the luminescent marks 31x, 31y with reference to FIG. 1. This detection system (hereinafter termed an [ISS system]) serves to measure the position of the reticle R.

A detailed configuration of the ISS system is disclosed, for example, in the U.S. Pat. No. 4,853,745 so that only a brief description thereof will be made below.

Figure 4A:
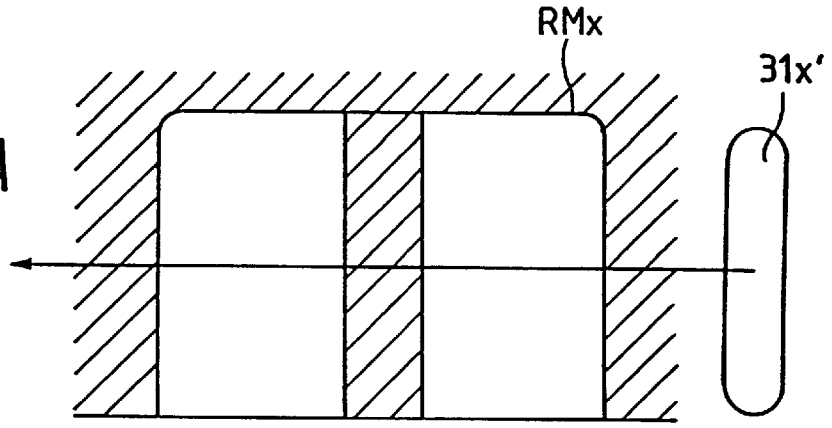
FIG. 4A is a view showing a situation of how scanning of an image 31x' of a luminescent mark 31x which is formed on a pattern surface of the reticle R is effected with respect to an alignment mark Rmx.
Figure 4B:
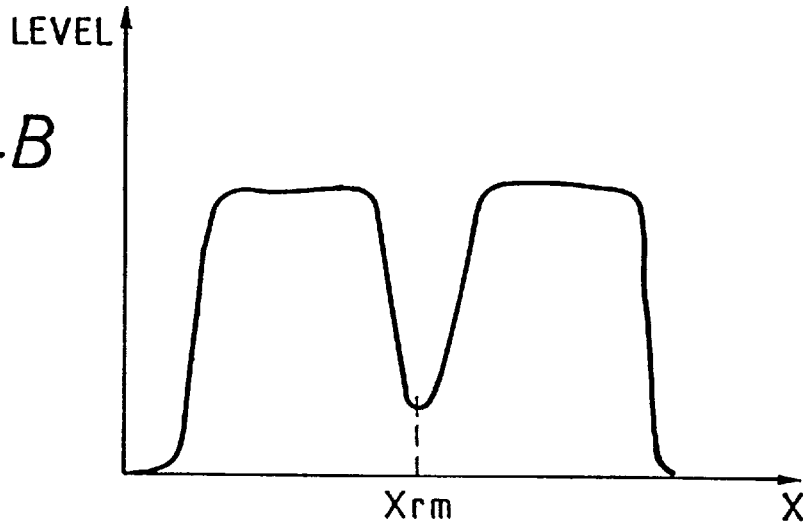
FIG. 4B is a diagram showing variations in a photoelectric signal obtained from a photoelectric detector 14 at that time.

Referring again to FIG. 1, a light source 8 emits a beam of illumination light IE having the same wavelength as that of the illumination light IL for exposure or a wavelength in the vicinity thereof. This illumination light beam IE travels into an interior (a lower portion of the fiducial plate FM) of the stage ST via a fiber 10 as well as via a lens 9. The illumination light beam IE emerging from the fiber 10 is converged by a lens 11 and falls on the luminescent marks 31x, 31y from under. Images of the luminescent marks 31x, 31y are formed on the alignment mark RMy provided on the reticle R. At this time, the main control system MCS performs a relative scan with respect to the alignment mark RMy and the luminescent mark 31y by scanning the wafer stage WS in the Y-direction. The light beam penetrating the alignment mark RMy is received by a photoelectric detector 14 via a mirror M, a condenser lens CL and a beam splitter 13. FIG. 4A illustrates a situation of how the scanning of an image 31x' of the luminescent mark 31x which is formed on the pattern surface of the reticle R is effected on the alignment mark RMx. FIG. 4B is a view showing variations in a photoelectric signal obtained from the photoelectric detector 14 at that time. Turning to FIG. 4B, the axis of ordinates indicates a level of signal, while the axis of abscissas indicates an X-directional coordinate value of the stage which is obtained from the stage interferometer 3. Herein, when the mark image 31x' is overlapped with the mark portion of the alignment mark RMx, the photoelectric detector 14 receives almost no illumination light beam IE, and, therefore, the level of the photoelectric signal reaches the bottom. A signal processor 101 detects a central position Xrm of this bottom on the basis of a signal $S_2$ transmitted from the stage interferometer 3.

In the same way, the main control system MCS performs scanning of the image of the luminescent mark 31y on the alignment mark RMy, the mark 31y's image being formed on the pattern surface of the reticle R. Then, the signal processor 101 detects a position Yrm in which a detection signal obtained from the photoelectric detector 14 reaches the bottom at that time. Then, the main control system MCS inputs these measured values (Xrm, Yrm) from the signal processor 101.

The main control system MCS memorizes beforehand positional relationships between the alignment marks RMx, RMy and the point-of-center RC of the reticle R. It is therefore possible to detect a position of the point-of-center RC of the reticle R on the basis of the above two measured values (Xrm, Yrm).

Referring again back to FIG. 1, the construction of the focus detection system incorporated into the present apparatus will be discussed. The focus detection system in this embodiment is constructed of a light sending system (15, 16, 17) and a light receiving system (19, 20, 21). A projector 15 emits a beam of light (e.g., an infrared ray, etc.) having a wavelength that does not photosensitize a photosensitive agent coated on the wafer W. This projector 15 incorporates a light sending slit plate, and, hence, the light passing through this slit plate is emitted from the projector 15. Then, this light travels via a plane-parallel glass 16 and a condenser lens 17 and falls on the wafer W as a slit image SP. A point-of-center of this slit image SP is, as illustrated in FIG. 1, positioned at an intersecting point between the optical axis AX of the projection optical system PL and the surface of the wafer W. Referring to FIG. 1, the wafer surface is disposed on the imaging plane of the projection optical system PL. Further, the plane-parallel glass 16 is placed in the vicinity of the light sending slit plate. The plane-parallel glass 16 also has rotary shafts in the direction (Y-direction) perpendicular to the sheet surface of FIG. 1 and in a direction parallel to the sheet surface. The plane-parallel glass 16 is capable of making micro-rotations about the centers of these rotary shafts. A drive unit 18a causes the plane-parallel glass 16 to rotate within a range of predetermined angles about each rotary shaft. With this rotation, an image forming position of the slit image SP shifts in the directions (X- and Y-directions) substantially parallel to the surface of the wafer W. A drive unit 18c causes the lens 17 to move substantially in parallel to the optical axis of the light sending system. With this movement, the in-focus state of the slit image SP on the surface of the wafer W can be adjusted.

A light beam (reflected light) reflected from the wafer W passes through a lens 19 and a plane-parallel glass 20 and is received by a light receiving unit 21. This light receiving unit 21 incorporates a light receiving slit plate. The light receiving unit 21 photoelectrically detects the light penetrating this light receiving slit plate. The plane-parallel glass 20 also has a rotary shaft in the Y-direction and is rotated by a drive unit 18b within a range of predetermined angles. When the plane-parallel glass 20 rotates, a light receiving position in which the light receiving unit 21 receives the reflected light shifts. A shifting direction of the light receiving position of the reflected light is the same as a direction in which the light receiving position of the reflected light shifts when the wafer W moves in the Z-axis direction. A detection signal Sa from the light receiving unit 21 is outputted to a signal processor 103. The signal processor 103 detects a quantity of deviation in the optical-axis direction AX between the surface of the wafer W and the fiducial plane prescribed by the focus detection system. This quantity of deviation is outputted to the main control system MCS. Note that the fiducial plane of the focus detection system is preset to align with the imaging plane of the projection optical system PL in this embodiment.

Figure 13:
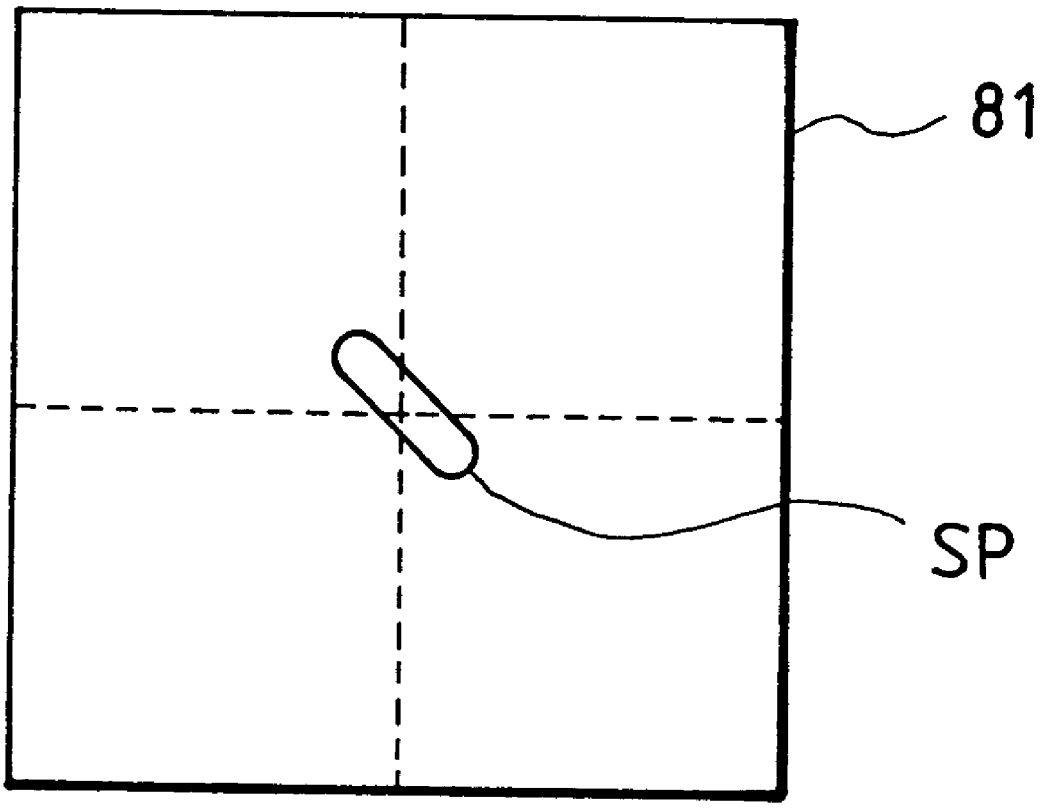
FIG. 13 is a view showing a situation of how the slit image is projected on the area sensor shown in FIG. 1.

Further, an area sensor (e.g., two-dimensional CCD) 81 for receiving slit image light SP from the focus detection system is provided on the Z stage ST2. FIG. 13 is a view showing in a paticula situation, how the slit image SP is incident on the area sensor 81. This area sensor 81 picks up the slit image SP incident on the light receiving plane of the area sensor 81 and, at the same time, outputs an image signal therefrom to an image processing device 82. The image processing device 82 detects a position of the slit image SP and an imaging status of the slit image on the basis of the image signal from the area sensor 81.

Now, the present apparatus further comprises an off-axis alignment system for detecting the marks on the wafer W. A detailed configuration of this alignment system is disclosed in Japanese Patent Laid-Open Application No. 62-171125 and therefore is only briefly explained herein.

Referring to FIG. 1, an optical axis 1 of an alignment optical system 22 is spaced at a distance L away from the optical axis AX of the projection optical system PL in the X-axis direction. Then, the alignment optical system 22 irradiates the wafer W with beams of light exhibiting a broad wavelength distribution having a certain band width as illumination light. Subsequently, a center-of-detection $P_2$, on the wafer W, of the alignment optical system 22 is determined to align with an axis of measurement of the stage interferometer 3.

Figure 5A:
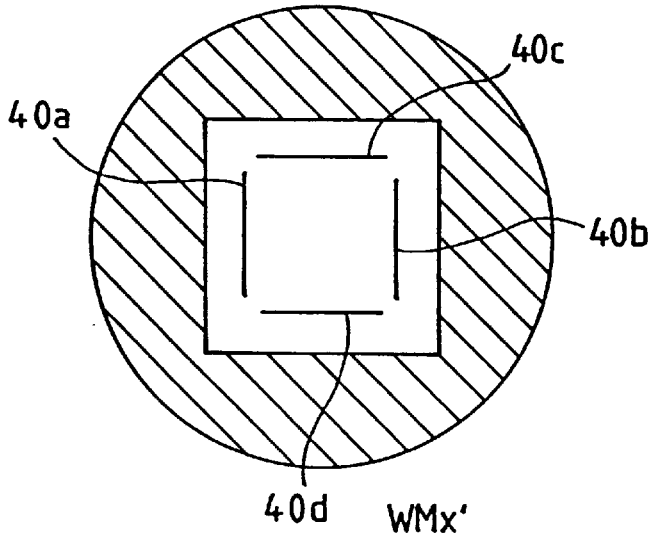
FIG. 5A is a view illustrating an index plate provided in an off-axis alignment system.
Figure 5B:
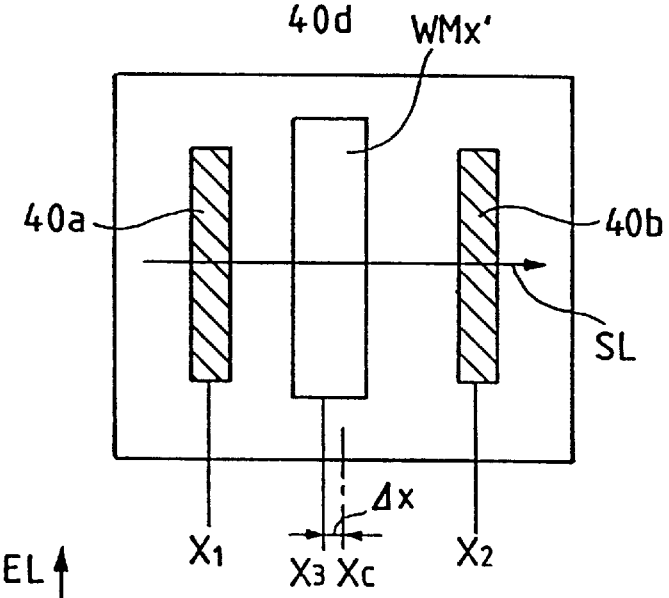
FIG. 5B is a view showing a situation of how the off-axis alignment system detects a mark WMx on a wafer W.
Figure 5C:
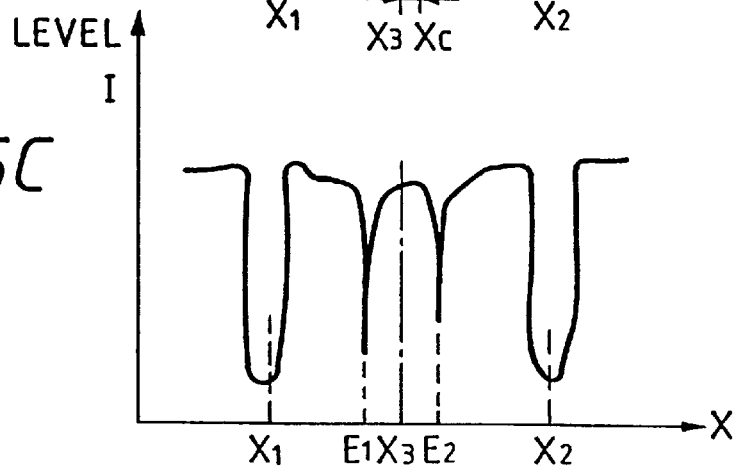
FIG. 5C is a diagram illustrating a waveform of a video signal at that time.

Now, the beams of reflected light from the marks on the wafer W are incident on the alignment optical system 22. Images of the marks are formed on a lower surface of an index plate provided in the alignment optical system 22. This index plate, as illustrated in FIG. 5A, has rectilinear index marks 40a, 40b, 40c, 40d extending in the X- and Y-directions respectively with a rectangular transparent window. Then, the mark images on the wafer W are formed on an image pick-up surface of a pick-up tube 23 together with images of the index marks 40a–40d formed on the index plate. FIG. 5B shows how the pick-up tube 23 detects a mark WMx on the wafer W. The main control system MCS controls the XY drive system 1 to locate the wafer W so that an image WMx' of the mark WMx on the wafer W is positioned between the index marks 40a and 40b. At this time, it is assumed that a central position $X_3$ of the mark image WMx' deviates by Δx in the X-direction with respect to a central position Xc in the X-direction between the index marks 40a and 40b. This deviation quantity Δx is a so-called alignment offset. When these marks 40a, 40b, WMx are positioned in a predetermined scan area, a video signal by a scan line SL assumes a waveform as shown in FIG. 5C. Referring to FIG. 5C, the axis of ordinates represents a magnitude (level) I of the signal, while the axis abscissas represents a position (X) of the scan-line direction SL. The index marks 40a, 40b are illuminated with the reflected light from the wafer W, and hence the level I reaches the bottom in positions $X_1$, $X_2$. Further, in connection with the mark WMx on the wafer W, beams of scattered light are caused by two step edges extending in parallel in the directions orthogonal to the scan line SL, and, therefore, the level I of the mark image WMx' reaches the bottom in positions $E_1$, $E_2$. A signal processor 102 detects a position Xc as a mid-point between the positions $X_1$ and $X_2$. The signal processor 102 also detects a position $X_3$ as a mid-point between the positions $E_1$ and $E_2$. Accordingly, the alignment offset Δx is expressed by the following formula:

[Formula 1]

$$\Delta x = \frac{X_1 + X_2}{2} - \frac{E_1 + E_2}{2} \quad (1)$$

Then, when the stage ST is moved by −Δx from the present position in the X-direction, it follows that the alignment is attained. The mark WMy on the wafer W can be also detected in the same way as the above-mentioned way.

Further, a display unit CRT is provided in this embodiment. For instance, an operator is informed of measured results by displaying the results of a variety of measurements on a screen in the present apparatus. Further, the operator is capable of inputting conditions for an exposure operation to the main control system MCS from the display unit CRT. Moreover, referring to FIG. 1, the main control system MCS outputs control signals $S_1$ to the wafer stage controller WSC and the reticle stage controller RSC and, besides, generally controls the present apparatus as a whole.

Figure 11:
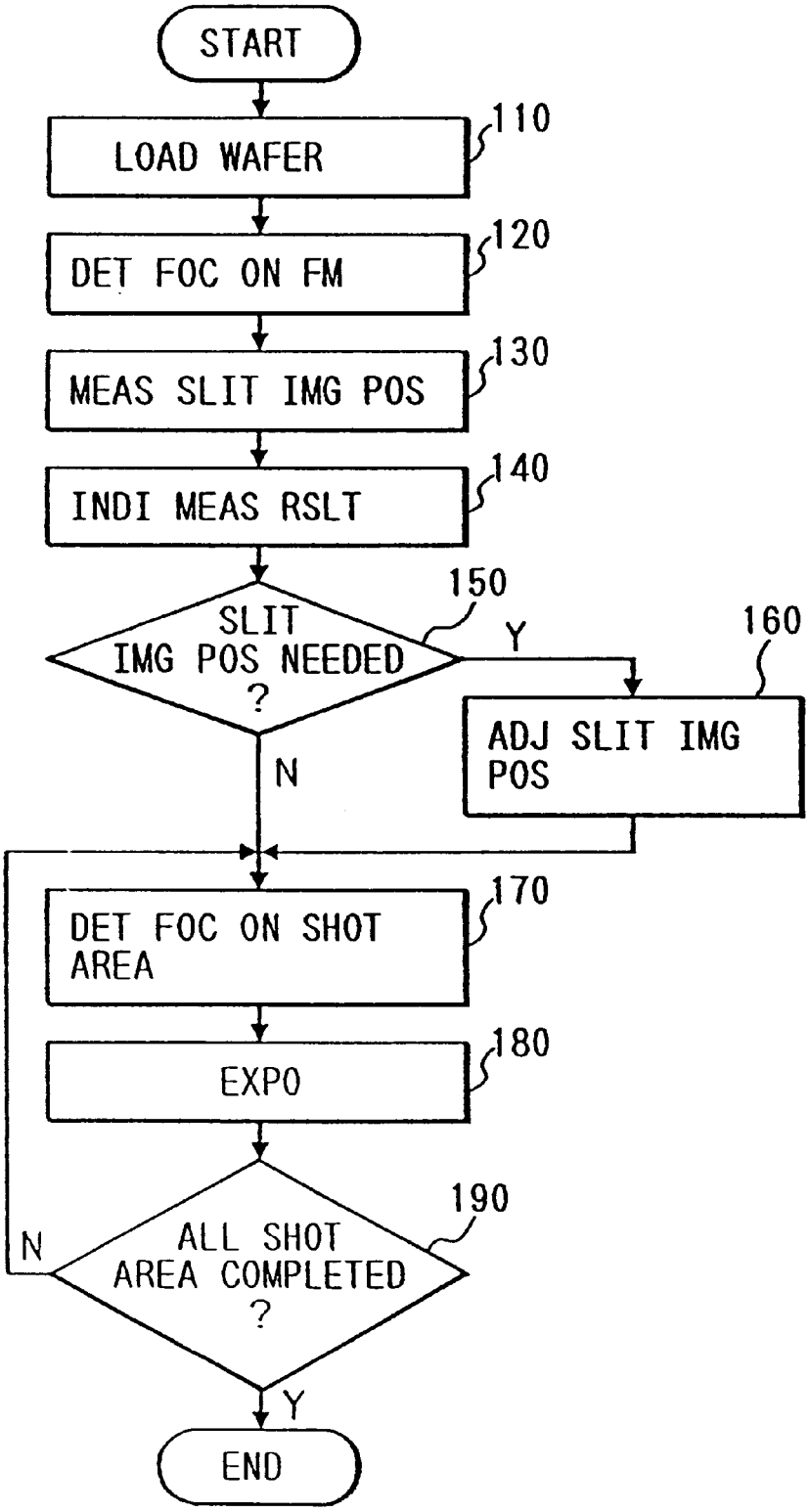
FIG. 11 is a flowchart in a first embodiment of this invention.

Now, the operation in this embodiment will be next explained with reference to a flowchart of FIG. 11. Further, it is assumed in this embodiment that the reticle R is, as explained earlier, located by the reticle alignment system or the ISS system so that the point-of-center RC is aligned with the optical axis (AX).

Figure 6A:
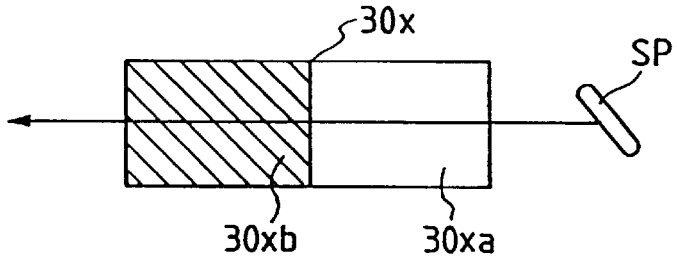
FIG. 6A is a view illustrating a situation of how a relative scan between the fiducial mark 30x and the slit image SP is performed.
Figure 6B:
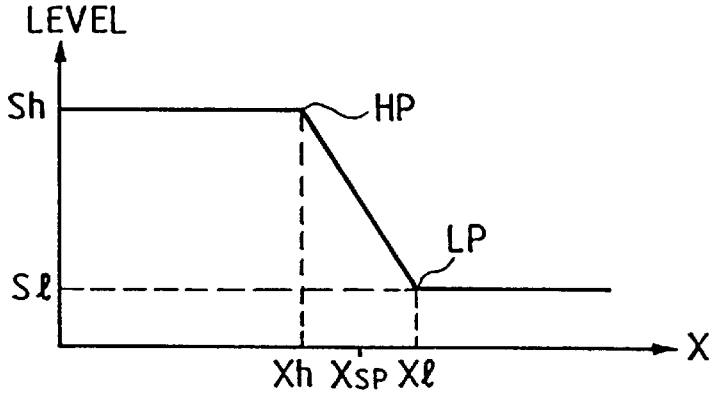
FIG. 6B is a diagram showing variations in a photoelectric signal obtained by a light receiving unit 21 at that time.

To start with, in step 110, the wafer W is carried on the stage ST. Then, the main control system MCS moves the stage ST so that the slit image SP is incident on an area with no formation of the mark on the fiducial plate FM, thus detecting a focal point (step 120). Next in step 130, a coordinate position of the slit image is obtained. The main control system MCS controls the wafer stage controller WSC to move the stage ST in the X-direction. The main control system MCS, as shown in FIG. 6A, performs scanning of the rectangular fiducial mark 30x extending in the X-direction with respect to the slit image SP. For convenience, FIG. 6A illustrates a situation in which the scanning of the slit image SP is effected, with the fiducial mark 30x being fixed. FIG. 6B is a diagram showing a photoelectric signal obtained by the light receiving unit 21 at that time. Paying attention to FIG. 6B, the axis of ordinates indicates a level (a voltage value) of the photoelectric signal, while the axis of abscissas indicates an X-direction coordinate value of the stage which is obtained by the stage interferometer 3. Let Sh be the level when the whole slit image SP falls on the high-reflection area 30xa of the fiducial mark 30x, and let S1 be the level when the slit image SP falls on the low-reflection area 30xb. Then, HP is a point at which the signal level starts decreasing toward S1 from Sh, and LP is a point at which the signal level reaches S1. The signal processor 103 measures a point-of-center Xsp between an X-coordinate value Xh at the point HP and an X-coordinate value X1 at the point LP on the basis of an item of positional data given from the stage interferometer 3. This point-of-center Xsp is an X-coordinate value when the point-of-center of the slit image SP passes through a boundary line between the high-reflection area 30xa and the low-reflection area 30xb.

Similarly, the main control system MCS controls the wafer stage controller WCS to perform the relative scan between the slit image SP and the fiducial mark 30y. Subsequently, the signal processor 103 measures a Y-coordinate value Ysp when the point-of-center of the slit image SP passes through a boundary line between the high-reflection area 30ya and the low-reflection area 30yb. Based on these measured values (Xsp, Ysp), the main control system MCS obtains a position (ox, Gy), on the XY-coordinate system, of the slit image PS, with the optical axis AX serving as an origin (0, 0).

Figure 7:
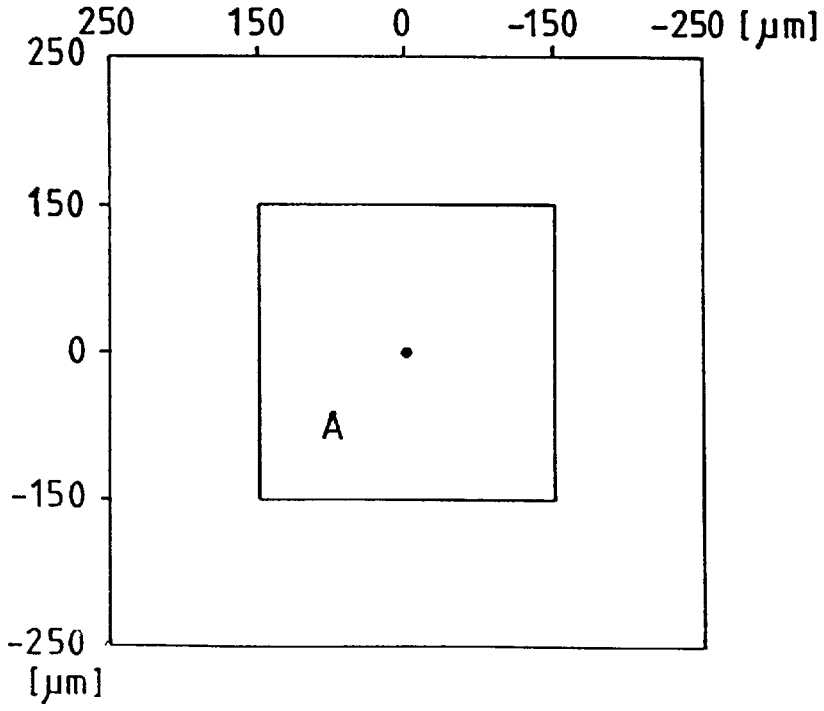
FIG. 7 is a view illustrating one example of displaying an image forming position of the slit image SP through a display unit CRT.

Next, the main control system MCS, in step 140, causes the display unit CRT to display a positional deviation of this slit image SP from the optical axis AX. FIG. 7 is a diagram showing one example of the display screen thereof. A set position of the slit image SP is the position (0, 0) of the optical axis AX. This set position is a point-of-center within a frame shown in FIG. 7. Then, the position of the slit image SP with respect to this set position is indicated by "A" on a map. An internal square frame indicates an allowable range of the positional deviation of the slit image SP from the set position. When positioned outwardly of this frame, it is required that the position of the slit image SP be adjusted. This allowable range may be freely set by the operator. The operator determines whether or not the position of the slit image SP is adjusted in accordance with a state of the positional deviation of the slit image SP which is displayed on the display unit CRT (step 150). Then, the operator transmits a command of adjusting the position of the slit image SP to the main control system MCS via the display unit CRT. Based on this command, the main control system MCS adjusts an angle of rotation of the plane-parallel glass 16 through the drive unit (or member) 18a. The main control system MCS adjusts and aligns the position of the slit image SP with the set position (step 160).

The main control system MCS may automatically determine whether to adjust the position of the slit image SP. The operator may also manually adjust the position of the slit image SP; or alternatively, the main control system MCS may automatically adjust the position thereof when the positional deviation exceeds the allowable range.

When finishing the positional adjustment of the slit image SP, the process enters an exposure step of exposing the reticle pattern on each shot area. To begin with, the first shot area to be exposed is disposed under the projection optical system, and a focal point of the shot area is detected (step 170). Subsequently, this shot area is disposed on the imaging plane of the projection optical system PL, and, thereafter, the pattern of the reticle R is superposed on the shot area, thus effecting an exposure (step 180). Then, steps 170, 180 are repeatedly conducted (step 190) until the exposing process on all the shot areas on the wafer W is finished.

When detecting the focal point of each shot area by the operation described above, the slit image SP is always formed in the central position of each shot area. It is therefore feasible to stably detect the focal point with high accuracy all the time irrespective of the rugged portion in the shot area.

Figure 8A:
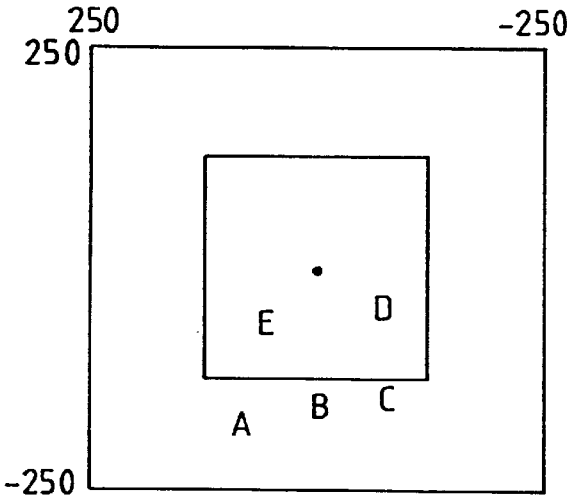
FIGS. 8A and 8B are views showing one example of displaying the image forming position of each slit image through the display unit CRT when a plurality of slit images are formed.
Figure 8B:
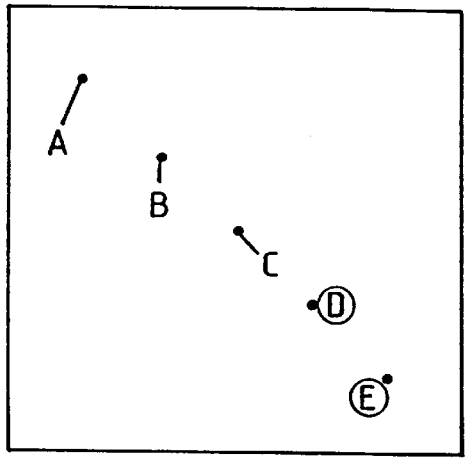

Now, there has been explained the focus detection system for measuring one-point focal position in the shot area by irradiating the slit image SP with the light on the wafer W in this embodiment. The present invention can be, however, similarly employed for a focus detection system for detecting the focal points at a plurality of points within the on-wafer shot areas as disclosed in, e.g., U.S. Pat. No. 5,502,311, now abandoned. The main control system MCS measures coordinate values of (e.g., five pieces of) slit images by the same operation as that used in the preceding first embodiment. The main control system MCS then measures a deviation quantity of each slit image from the set position. FIGS. 8A and 8B illustrate one example of the screen display through the display unit CRT at that time. FIG. 8A is a view showing which direction and what degree each of the actual positions of the respective measuring points (A, B, C, D, E) deviates from the predetermined set position as in the same way with the above display screen shown in FIG. 7. The operator is capable of simply knowing whether or not the deviation quantity of each slit image falls within the predetermined allowable range. Further, FIG. 8B is a view showing the display screen indicating positional relationships between the actual measuring points and the respective design measuring points within the shot area. According to the above display method, it is possible to know at which position each measuring point exists within the shot area. Referring also to FIG. 8B, the deviation quantity is marked with a circled letter when the deviation quantity falls within the predetermined allowable range. It is therefore feasible to known which slit image position has to be adjusted.

Figure 12:
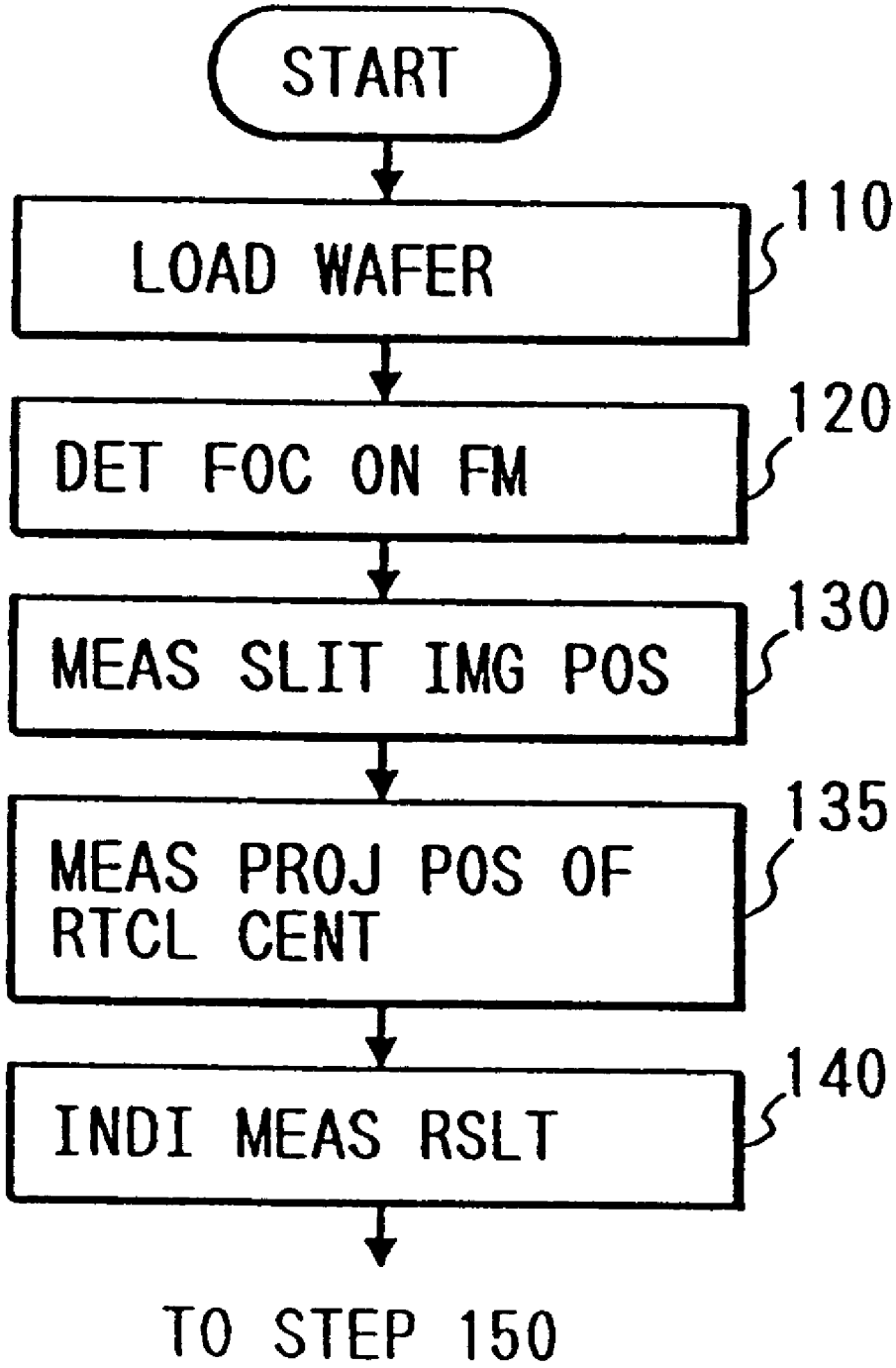
FIG. 12 is a flowchart in a second embodiment of this invention.

Next, a second embodiment of the present invention will be discussed with reference to a flowchart of FIG. 12. The apparatus used in this embodiment is absolutely the same as that in the first embodiment. A different point of this embodiment from the first embodiment is that the position of the slit image is adjusted in consideration of the positional deviation of the reticle R.

Figure 9:
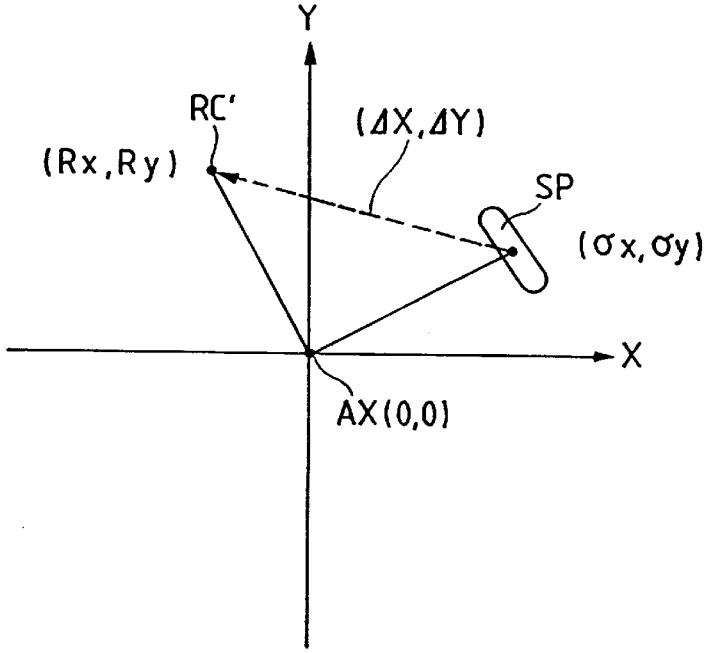
FIG. 9 is a view showing a positional relationship between the slit image SP on the wafer W, the optical axis AX and a projection position RC' of a point-of-center RC of the reticle R.

Now, with the same operations (steps 110–130) as those in the preceding first embodiment, the main control system MCS detects the position ($\sigma x$, $\sigma y$), on the XY-coordinate system, of the slit image SP. Next, as explained in the preceding first embodiment, the alignment marks RMx, RMy are detected by use of the luminescent marks 31x, 31y, thereby obtaining the projection position (Rx, Ry) of the point-of-center of the reticle R through the projection optical system PL (step 135). FIG. 9 is a diagram showing a positional relationship between the slit image SP on the wafer W, the optical axis AX and a projection point (a point-of-center of the shot area) RC' of the point-of-center RC of the reticle R through the projection optical system PL. When performing an overlap-exposure, each shot area is disposed so that its point-of-center is aligned with the projection position of the point-of-center of the reticle R. More specifically, if the projection position of the point-of-center of the reticle deviates from the optical axis AX, as a matter of course, the point-of-center of the shot area also deviates from the optical axis AX. Accordingly, even when the slit image of the focus detection system exists on the optical axis AX, the slit image does not necessarily fall on the point-of-center of the shot area. For this reason, the main control system MCS measures a positional deviation ($\Delta X$, $\Delta Y$) between the position of the slit image SP and the position of the point-of-center RC' of the shot area on the basis of the previously detected coordinate value ($\sigma x$, $\sigma y$) of the slit image SP and the coordinate value (Rx, Ry) of the point RC', the positional deviation being given by ($\Delta X$, $\Delta Y$)=(Rx−$\sigma x$, Ry−$\sigma y$). Subsequently, the display unit CRT displays, as shown in FIG. 7, a slit image forming position (step 140) as in the preceding first embodiment, wherein the fiducial position is the projection position of the point-of-center of the reticle R. Then, the point-of-center of the slit image SP is aligned with the point-of-center RC' of the shot area by the same operations after step 150 inclusive in the first embodiment. This makes it possible to form the slit image at the point-of-center of each shot area at all times.

Further, the fiducial marks 30x, 30y for detecting the position of the slit image are not confined to those in the first and second embodiments discussed above but may be marks which will be mentioned hereinbelow. Other examples of the fiducial marks will be explained referring to FIGS. 10A and 10B.

Figure 10A:
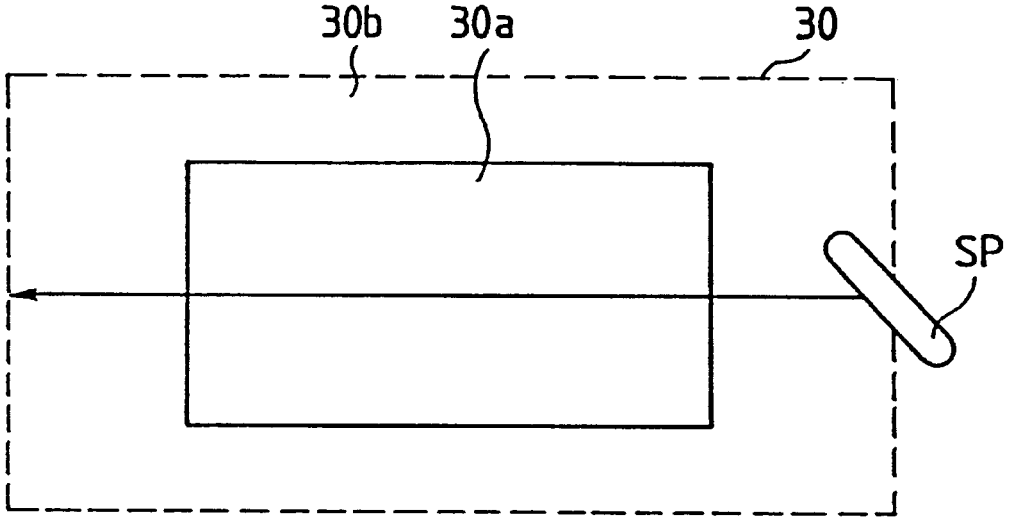
FIG. 10A is a view showing a situation of how the relative scan between the slit image SP and a fiducial mark 30 is performed.
Figure 10B:
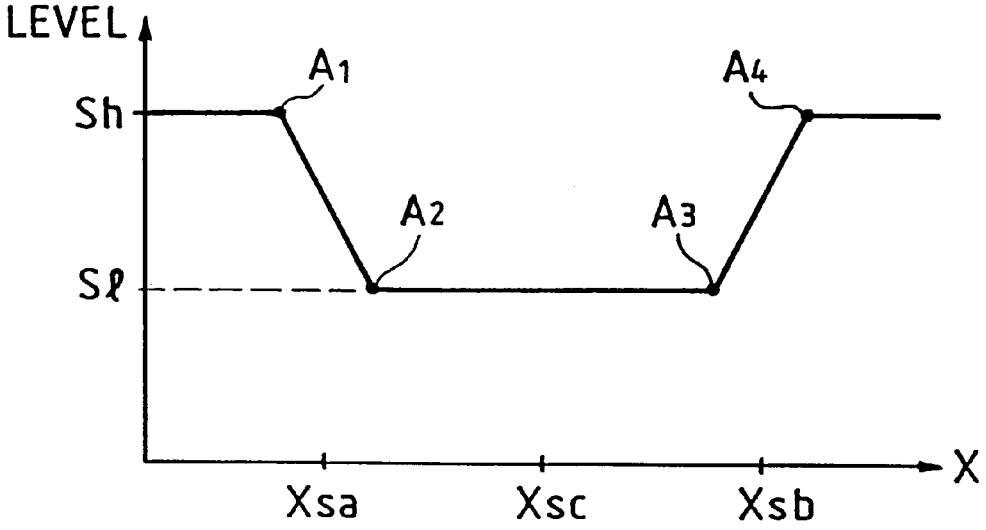
FIG. 10B is a diagram showing variations in the photoelectric signal obtained by the light receiving unit 21 at that time.

As depicted in FIG. 10A, a fiducial mark 30 is formed of two areas each exhibiting a different reflectivity, wherein the two areas are a mark portion 30a, i.e., a low-reflection area, consisting of, e.g., quartz or the like and a peripheral portion 30b, viz., a high-reflection area, coated with a chrome layer. This fiducial mark 30 is formed on the fiducial plate FM shown in FIG. 3. The main control system MCS performs the relative scan between the slit image SP and the fiducial mark 30 by moving the wafer stage ST in the X-direction. For convenience, FIG. 10A illustrates a situation in which the scanning of the slit image SP is effected, with the fiducial mark 30 being fixed. FIG. 10B shows a level of the photoelectric signal obtained by the light receiving unit 21 at that time. Herein, let Sh be the level of the photoelectric signal when the scan of the slit image SP is effected with respect to the peripheral portion 30b, and let S1 be the level of the photoelectric signal when the scan of the slit image SP is performed with respect to the mark portion 30a. Then, as illustrated in FIG. 10B, $A_1$ is a point at which the signal level decreases toward S1 from Sh; $A_2$ is a point at which the signal level reaches S1; $A_3$ is a point at which the signal level increases toward Sh from S1; and $A_4$ is a point at which the signal level again reaches Sh. The photoelectric signal from the light receiving unit 21 is outputted to the signal processor 103. The signal processor 103 measures an X-coordinate value Xsa of a mid-point between the points $A_1$ and $A_2$. The signal processor 103 also measures an X-coordinate value Xsb of a mid-point between the points $A_3$ and $A_4$. The signal processor 103 measures a center between the respective X-coordinate values Xsa and Xsb as an X-coordinate position Xsc of the slit image SP. Similarly, the signal processor 103 measures a Y-coordinate value Ysp of the slit image SP by effecting the relative scan between the slit image SP and the fiducial mark 30. Coordinate signals thereof are outputted to the main control system MCS. Then, the main control system MCS obtains a position ($\sigma x$, $\sigma y$), on the y-coordinate system, of the slit image SP on the basis of those coordinate signals.

As described above, the position of the slit image SP is detected based on the photoelectric signals given from the light receiving unit 21 when performing the relative scan between the slit image SP and the fiducial mark including the two areas each exhibiting the different reflectivity. Further, an algorithm for calculating the XY-coordinate values of the slit image SP is not limited to that in the embodiments discussed above.

Besides, in the first and second embodiments described above, the stage ST is moved in the X- and Y-directions, thus scanning the fiducial mark with respect to the slit image SP. However, the slit image SP may be scanned with respect to the fiducial mark by driving the plane-parallel glass 16. At this time, the main control system MCS aligns the point-of-center of the fiducial mark with the optical axis AX or the projection position of the point-of-center of the reticle R. Measured subsequently is an angle of rotation of the plane-parallel glass when the point-of-center of the slit image passes through the point-of-center of the fiducial mark. Thereafter, if aligned with this angle, the slit image is formed on the optical axis AX or in the projection position of the point-of-center of the reticle R.

Further, in the second embodiment discussed above, the position of the slit image SP is adjusted. However, the projection position of the point-of-center of the reticle R may be aligned with the position of the slit image SP by moving the reticle R. When moving the reticle R, however, there varies a spacing (a baseline quantity) between the alignment position of the shot area on the wafer W and the exposure position of that shot area. Accordingly, in the case of moving the reticle R, it is required that this baseline quantity be measured. Then, the main control system MCS memorizes a position (X-coordinate value) $Xb_1$ in which the luminescent mark 31x on the stage ST is overlapped with the alignment mark RMx on the reticle R. Next, the main control system MCS memorizes a position (X-coordinate value) $Xb_2$ in which an off-axis alignment system (22, 23) detects a baseline measurement mark 32x formed on the fiducial plate FM. Let $\Delta Xb$ be the deviation quantity in the X-direction between the luminescent mark 31x and the mark 32x, and the main control system MCS calculates and memorizes ($Xb_1-Xb_2-\Delta Xb$) as an X-directional baseline quantity. Further, a Y-directional baseline quantity is also obtained in the same way. As stated above, when moving the reticle R, a baseline check may be conducted each time as stated above.

Next, a third embodiment of the present invention will be discussed. This embodiment also involves the use of the apparatus explained in the preceding first embodiment. This embodiment makes most of a typical alignment system and a deviation quantity ($\Delta X$, $\Delta Y$) between the position of the slit image SP which has been measured in the second embodiment. In accordance with this embodiment, there is utilized an enhanced global alignment (EGA) system which makes an attempt to obtain a high throughput and a high alignment accuracy at the same time. The details of this EGA system are disclosed in U.S. Pat. No. 4,780,617, and, therefore, only a brief explanation will be given herein.

According to the EGA system, there are measured positions of marks MYn, MXn of a plurality of (3 through 9) shot areas Sn on the wafer W. Based on the measured values thereof, parameters are obtained by the least squares approximation, these parameters being associated with a micro rotation error $\theta$ within a running coordinate system of the stage ST for the wafer W, i.e., the XY-coordinate system prescribed by the stage interferometer, a degree of orthogonality of a shot array (or running of the stage ST) on the wafer, scaling errors Rx, Ry due to the linear micro expansion and contraction of the wafer, and X- and Y-directional micro positional deviations of the wafer, viz., offset errors Ox, Oy. Then, the shot array coordinates in terms of design are transformed into actual shot array coordinates through an intermediary of those parameters; and a stepping position when exposed is obtained.

Now, in accordance with this embodiment, it is assumed that eight pieces of shot areas $S_1$–$S_8$ are prepared as sample alignment shot areas on the wafer W. Then, in the respective sample shot areas $S_1$–$S_8$, there are formed marks MXn, MYn (n is 1 through 8) into which the alignment marks RMx, RMy shown in FIG. 2 are projection-exposed on the wafer W. Let RCn (n is 1 through 8) be the points of centers of the respective sample shot areas $S_1$–$S_8$. The main control system MCS, as shown in FIG. 5B, controls the stage drive system 1 so that the off-axis alignment system (22, 23) detects the marks MXn, MYn of the eight sample shot areas $S_1$–$S_8$. The main control system MCS detects the alignment marks of the respective sample shot area and obtains the stepping position (Xn, Yn) when exposed.

Now, the main control system MCS, herein before locating the stage ST in the stepping position (Xn, Yn), causes the focus detection system illustrated in FIG. 1 to detect the focal point. The coordinate value of the slit image SP at that time, as shown in FIG. 9, deviates by ($\Delta X$, $\Delta Y$) in the X- and Y-directions from the point-of-center RC' of the shot area. These deviations are obtained by the operation explained in the preceding second embodiment. Hence, the main control system MCS performs the focus detection by locating the stage ST in a position corresponding to coordinate values (Xn+ΔX, Yn+ΔY). The main control system MCS thus locates the wafer surface on the imaging plane of the projection optical system PL. Then, the stage ST is located in the stepping position (Xn, Yn), and the exposure takes place.

According to the above sequence, it is possible to detect the focal point by making the slit image SP fall on the point-of-center RC' of the shot area all the time. Further, if there is prepared no plane-parallel glass 16 shown in FIG. 1, i.e., even when the position of the slit 5 image can not be adjusted, in accordance with this embodiment, the same effects as those in the preceding first and second embodiments are obtainable.

Now, in each of the three embodiments discussed above, when effecting the focus detection, the slit image SP or the reticle R or the wafer W is moved so that the slit image SP is formed at the point-of-center RC' of each shot area. The slit image SP is not necessarily formed at the point-of-center RC' of each shot area. For example, if the main control system MCS memorizes data about height positions (ruggedness) in an arbitrary location within each shot area, a result of detection performed by the focus detection system may be corrected in accordance with a deviation quantity between the height position at the point-of-center RC' and the height position at the point where the slit image is formed. The focus detection can be thereby done in the arbitrary location within the shot area.

Moreover, the slit image SP may be projected not at the point-of-center RC' of the shot area but on an area in the same height position as the point-of-center RC'. At this time also, as in the same way with the above-mentioned, the main control system MCS is required to memorize beforehand the data about the height positions (ruggedness) in the arbitrary location within each shot area.

Besides, the focus detection system in each embodiment discussed above presets the point-of-center RC' of the shot area as the focus detecting position. As a matter of course, however, the focus detecting position is not imitatively set at the point-of-center of the shot area but may be set in any positions within the shot area.

Next, a fourth embodiment of the present invention will be discussed with reference to a flowchart shown in FIG. 14. Also in this embodiment, the projection exposure apparatus (FIG. 1) described in the foregoing first embodiment is used. Note that the reticle R is positioned so that the point-of-center RC and the optical axis (AX) are aligned with each other by the reticle alignment system or the ISS system described above.

In step 210, the main control system MCS drives the XY stage ST1 to dispose the area sensor 81 at a position at which the point-of-center thereof intercepts the optical axis AX and to project the slit image SP on the area sensor 81. Further, the main control system MCS causes the Z stage ST2 to move in the Z direction by a very small quantity for each time and, at the same time, the image processing device 82 calculates the width of the slit image SP at each position (the height position) in the Z direction on the basis of an output (an image signal) from the area sensor 81. Then, the main control system MCS calculates the height position $Z_0$ of the Z stage ST2 (area sensor 81) when the width of the slit image SP is minimized. Further, the main control system MCS calculates a deviation quantity $\Delta Z=(=Z_0-Z_1)$ with the height position at which the wafer is set at the focus detection time (step 230). The width of the slit image SP has the minimum value when the focal point is most appropriate. Therefore, the deviation quantity ΔZ in the height direction is a value corresponding to a defocus quantity of the wafer with respect to the focus position ($Z_0$) of the slit image SP. In this case, the image processing device 82 memorizes a detection signal of the slit image corresponding to each picture element position of the area sensor 81, and calculates the position of the slit image SP and the width of the slit image SP mentioned above by processing said signal. These results of measurement are applied to the main control system MCS.

Next, in step 240, results of measurement of a focal point shift of the slit image SP are displayed on a display unit CRT (a display unit of the microcomputer). The operator determines whether the focal point of the slit image SP is to be adjusted or not on the basis of an imaging status of the slit image SP displayed on said display unit CRT (step 270).

When it is required to adjust the focal point of the SP in step 270, the operator sends a command for adjusting the focal point of the slit image SP to the main control system MCS through the display unit CRT (a keyboard of the microcomputer). The main control system MCS shifts the lens 17 in the optical axis of the light sending system through the drive unit (or adjustment device) 18c on the basis of this command to adjust thereby the focal point of the slit image on the wafer (step 280). After the adjustment, the program returns to the step 230 to confirm the focal point shift of the slit image.

In this case, whether the focal point of the slit image SP is to be adjusted or not may be automatically determined by the main control system MCS according to the program stored in the advance. Also, the adjustment of the focal point for the slit image SP may be performed manually by the operator. Further, the operations of the steps 210, 230, 240, 270 and 280 may be performed at the manufacturing time of the projection exposure apparatus, or may be performed immediately before an actual exposure operation. The latter method is employed in this embodiment.

Upon completion of the focal point adjustment of the slit image SP, the program enters an exposure step for exposing a pattern of the reticle on each shot area. First, in step 290, the wafer W is disposed on the wafer stage ST. Then, a first shot area to be exposed is disposed below the projection optical system PL to perform a focus detection for the shot area. Then, after said shot area is disposed on the imaging plane of the projection optical system PL, the pattern of the reticle R is superposed on the shot area to be exposed (step 300). Then, by the time the exposure is completed for all of the shot areas on the wafer W, the operations of steps 290 and 300 are repeated (step 310).

With the above-mentioned operations, it is possible to set three points, that is, the slit plate in the projector 15, a point at which the slit image falls on the wafer surface and the slit plate in the light receiving unit, in a substantially conjugate relation. As a result, it is possible to perform a stable focus detection with a high accuracy all the time.

Next, a fifth embodiment of the present invention will be described with reference to FIG. 15. In this embodiment, an operation for detecting the position of the slit image SP is added to the operations in the foregoing fourth embodiment. Therefore, the same reference numbers are given to steps in FIG. 15 that are the same as steps in fourth embodiment (FIG. 14). Note that the projection exposure apparatus (FIG.

1) described in the foregoing first embodiment is also employed in this embodiment. An operation of this embodiment will be described below.

First, when the slit image SP is incident on the area sensor 81 in step 210, the image processor 82 calculates a coordinate position (σx, σy) of the point-of-center of the slit image SP on the orthogonal coordinate system having the optical axis AX of the projection optical system PL as its origin on the basis of a detection signal from the area sensor 81 in step 220. Next, the main control system MCS shifts the Z stage ST2 by a small quantity each time in the Z direction and, at the same time, the image processor 82 calculates the width of the slit image SP at each position (the height position) in the Z direction. Then, the height position $Z_0$ at which the width of the slit image SP is minimized is obtained and, at the same time, a deviation quantity $\Delta Z=(=Z_0-Z_1)$ from the height position $Z_1$ when the coordinate position (σx, σy) of the slit image is measured is obtained (step 230).

Next, the main control system MCS indicates a positional deviation of this slit image SP from the optical axis AX and an imaging status of the slit image SP on the display unit CRT in step 240. An example of the display indicating the positional deviation of the slit image SP is the same as that shown in FIG. 7 and described in the foregoing first embodiment. That is, in FIG. 7, the position of the slit image SP is indicated as "A" on the map and the deviation quantity AZ calculated by the image processor 82 is indicated as a figure in the unit of μm below the indication of the "A".

An inner square frame in FIG. 7 indicates an allowable range for the deviation quantity from the set position of the slit image SP. When the slit image is positioned outside this frame, the position of the slit image SP needs to be adjusted. This allowable range can be set freely by the operator. The operator judges whether the position of the slit image SP is to be adjusted or not on the basis of conditions of the positional deviation and an imaging status of the slit image SP indicated on this display unit CRT (steps 250 and 270).

When it is required to adjust the position of the slit image SP in step 250, the operator sends a command for adjusting the position of the slit image SP to the main control system MCS through the display unit CRT. The main control system MCS adjusts an angle of rotation of the plane-parallel glass 16 through the drive unit 18a on the basis of this command. Thus, the position of the slit image SP is adjusted and the slit image SP is set at the point-of-center of the frame (step 260). After the adjustment, the program returns to the step 220 so as to confirm the position of the slit image.

Further, when it is required to adjust the imaging status of the slit image SP in step 270, the operator sends a command for adjusting the focal point of the slit image to the main control system MCS through the display unit CRT. The main control system MCS shifts the lens 17 in the direction of the optical axis of the light sending system through the drive unit 18c on the basis of this command. Thus, the focal point of the slit image is adjusted on the wafer (step 280). After the adjustment, the program returns to the step 230 so as to confirm the focal point of the slit image.

Whether the position of the slit image SP is to be adjusted or not may be automatically determined by the main control system MCS according to the program stored therein in advance. Also, the adjustment of the position and the focal point of the slit image SP may be performed manually by the operator system MCS when the positional deviation exceeds the allowable range.

Figure 14:
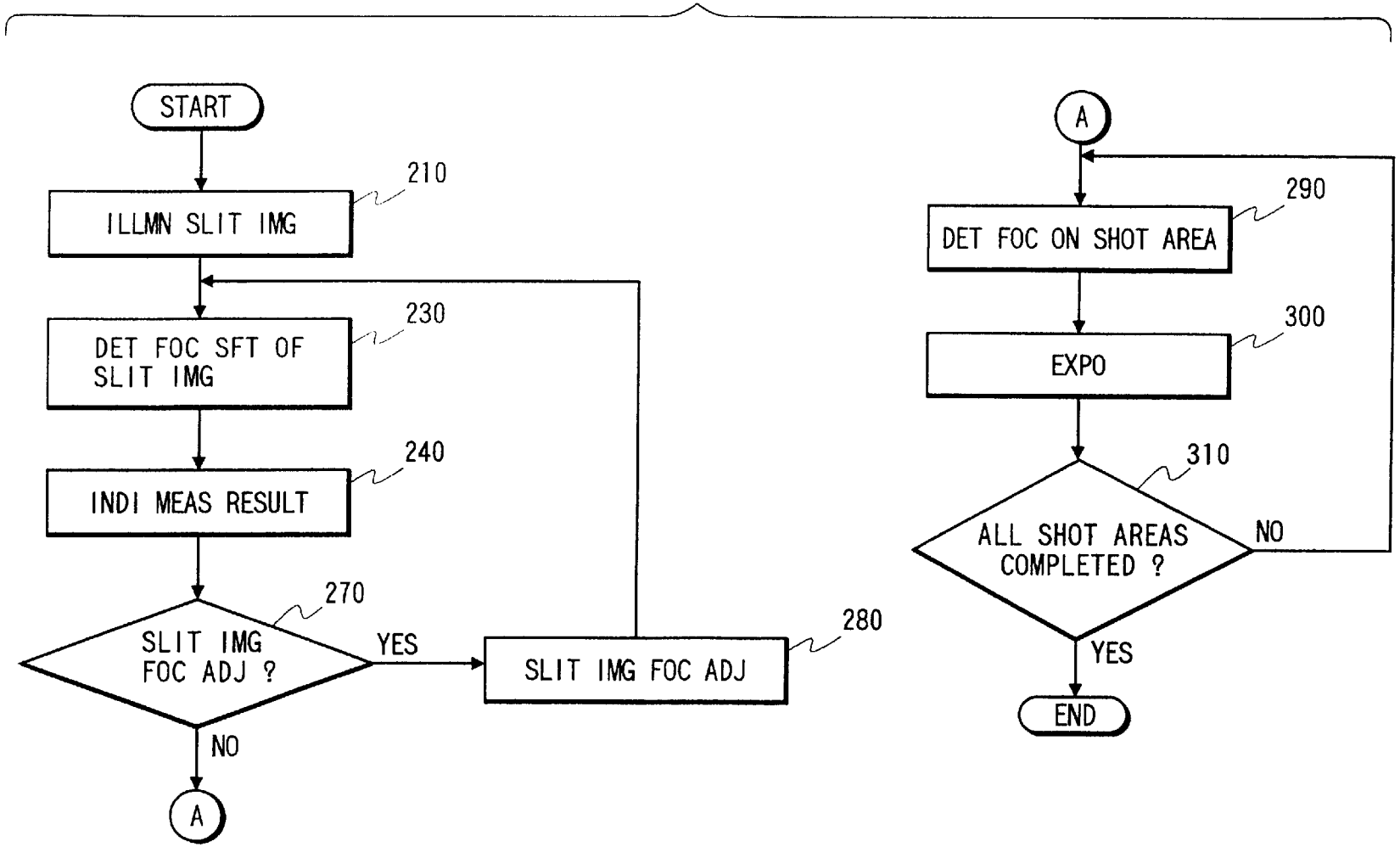
FIG. 14 is a flowchart in a fourth embodiment of this invention.
Figure 15:
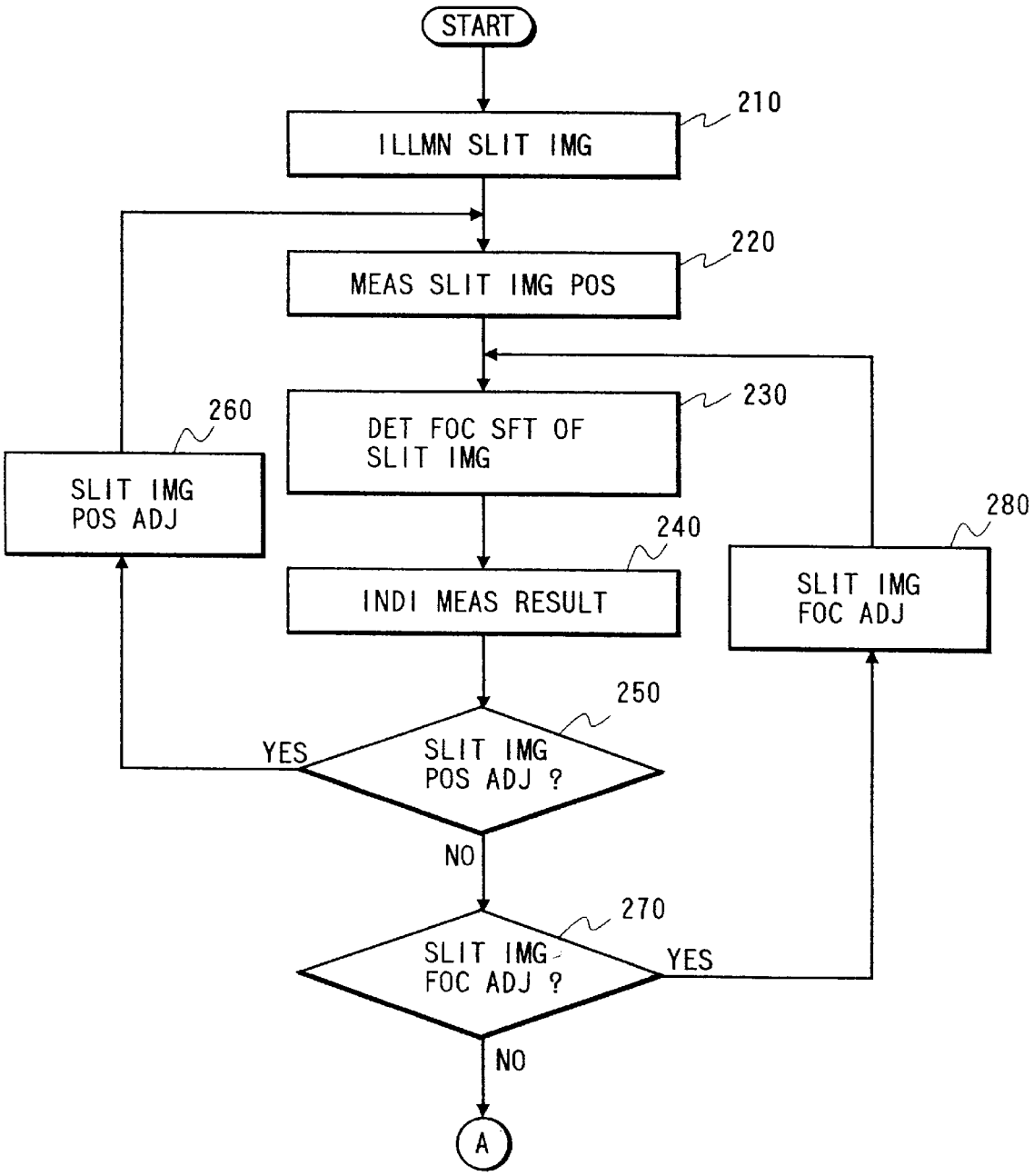
FIG. 15 is a flowchart in a fifth embodiment of this invention.

Upon completion of adjustment of the position and the focal point of the slit image SP, the program advances to the step 290 in FIG. 14 and enters the exposure step for exposing a pattern of the reticle on each shot area. An operation for this exposure step is the same as that in the foregoing fourth embodiment.

With the above-mentioned operations, the focal point of the slit image is made most appropriate on the wafer and the slit image is formed at the center of each shot area all the time. As a result, it is possible to perform a stable focus detection with a high accuracy all the time, regardless of ruggedness in the shot area.

In this embodiment, the focus detection system for measuring one focal position within the shot area by projecting one slit image SP on the wafer W was described. However, the present invention can be applied to a projection exposure apparatus, as disclosed in the U.S. Pat. No. 5,502,311 which comprises a multi-point focus detection system for performing a focus detection at a plurality of points in a shot area on the wafer to obtain the similar effects.

Figure 16:
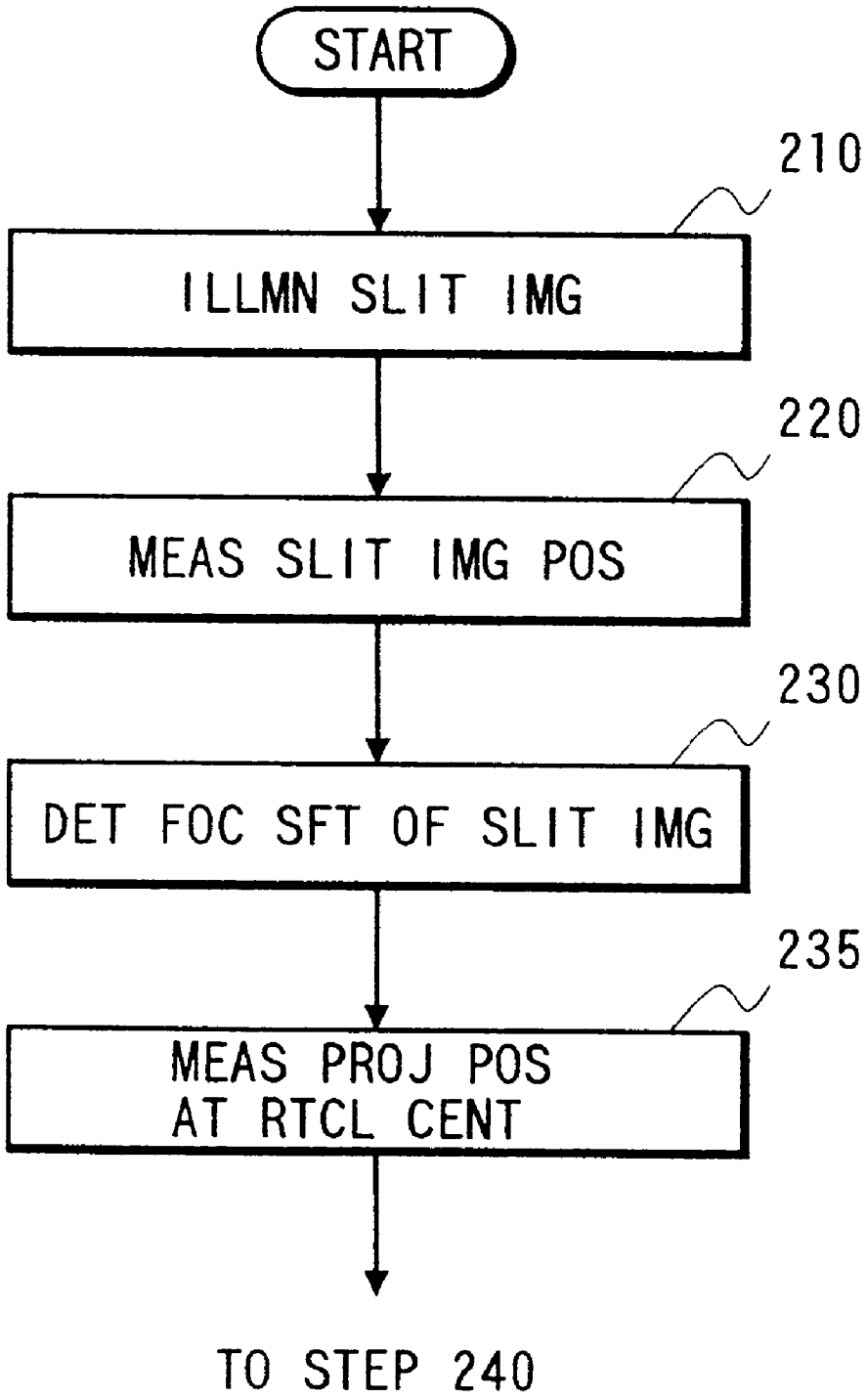
FIG. 16 is a flowchart in a sixth embodiment of this invention.

Next, a sixth embodiment of the present invention will be discussed with reference to a flowchart shown FIG. 16. A different point of this sixth embodiment from the fifth embodiment is that the position of the slit image is adjusted in consideration of the positional deviation of the reticle R. Note that the projection exposure apparatus (FIG. 1) described in the foregoing first embodiment is also used in this embodiment.

Now, with the same operations (steps 210–230) as those in the preceding fifth embodiment, the main control system MCS detects the position (σx, σy), on the XY-coordinate system, of the slit image SP, and a deviation quantity ΔZ in the height direction of the slit image SP. Next, the alignment marks RMx, RMy are detected by use of the luminescent marks 31x, 31y, thereby obtaining the projection position (Rx, Ry) of the point-of-center of the reticle through the projection optical system PL (step 235). In this case, a positional relationship between the slit image SP on the wafer W, the optical axis AX and a projection point (a point-of-center of the shot area) RC' of the point-of-center RC of the RC of the reticle R through the projection optical system PL is as shown in FIG. 9 which is described in the preceding second embodiment.

When performing an overlap-exposure, each shot area on the wafer W is disposed so that its point-of-center is aligned with the projection position RC' of the point-of-center of the reticle R. More specifically, if the projection position of the point-of-center of the reticle deviates from the optical axis AX, as a matter of course, the point-of-center of the shot area also deviates from the optical axis AX. Accordingly, even when the slit image of the focus detection system exists on the optical axis X, the slit image does not necessarily fall on the point-of-center of the shot area. For this reason, the main control system MCS measures a positional deviation (ΔX, ΔY) between the point-of-center of the slit image SP and the point-of-center RC' of the shot area on the basis of the previously detected coordinate value (σx, σy) of the slit image SP and the coordinate value (Rx, Ry) of the projection point RC', the positional deviation being given by (ΔX, ΔY)−(Rx−σx, Ry=σy). Subsequently, the display unit CRT displays, as shown in FIG. 7, the projection position of the slit image (step 240). Then, the point-of-center of the slit image SP is aligned with the point-of-center RC' of the shot area by the same operations as those following the step 250 in the fourth embodiment. In this way, the slit image can be formed at the point-of-center of each shot area all the time.

In the sixth embodiment discussed above, the position of the slit image SP was adjusted. However, the projection position of the point-of-center of the reticle R may be aligned with the position of the slit image SP by moving the reticle R. When moving the reticle R, however, there varies a spacing (a baseline quantity) between the alignment position of the shot area on the wafer W and the exposure position of that shot area. Accordingly, in the case of moving the reticle R, it is required that this baseline quantity be measured, or the baseline quantity be corrected by calculation on the basis of quantity of movement of the reticle R.

Then, the main control system MCS detects and memorizes a position (X-coordinate value) $Xb_1$ in which the luminescent mark 31x on the stage ST is overlapped with the alignment mark RMx on the reticle R by using said luminescent mark 31x. Next, the main control system MCS detects and memorizes a position (X-coordinate value) $Xb_2$ in which an off-axis alignment system (22, 23) detects a baseline measurement mark 32x formed on the fiducial plate FM by using said mark 32x. Let Δxb be the space in the x-direction between the luminescent mark 31x and the baseline measurement mark 32x, and the main control system MCS calculates and memorizes ($Xb_{1-Xb2}$−Δxb) as an X-directional baseline quantity. Further, a Y-directional baseline quantity is also obtained in the same way. As stated above, when moving the reticle R, a baseline check may be conducted each time. Or, a quantity of movement of the reticle R may be obtained on the basis of an output from the interferometer for measuring the position of the reticle stage for moving the reticle R so as to correct the 5 baseline quantity by a value which is obtained by multiplying this quantity of movement by a magnification of the projection optical system PL. In this case, the baseline quantity can be obtained only by a calculation without a measurement of the baseline so that there is an advantage that a decrease in throughput can be prevented.

Next, a seventh embodiment of the present invention will be discussed. This embodiment also involves the use of the projection exposure apparatus (FIG. 1) explained in the preceding first embodiment. This embodiment makes the most of a typical alignment system employed in the projection exposure apparatus and a deviation quantity (ΔX, ΔY) between the point-of-center of the slit image SP which has been measured in the previous sixth embodiment and the point-of-center RC' of the shot area. In accordance with this embodiment, there is utilized an enhanced global alignment (EGA) system which makes an attempt to obtain a high throughput and a high alignment accuracy at the same time. The details of this EGA system are disclosed in U.S. Pat. No. 4,780,617 and U.S. Pat. No. 4,833,621, and, therefore, only a brief explanation will be given herein.

According to the EGA system, there are measured positions of alignment marks MYn, MXn attached to a plurality of (around 10, for example) shot areas Sn on the wafer W. Based on the measured values thereof, parameters are obtained by the least squares approximation, these parameters being associated with a micro rotation error θ of the wafer within a running coordinate system of the stage ST, i.e., the XY-coordinate system prescribed by the interferometer 3, a degree of orthogonality w of a shot array (or running of the stage ST) on the wafer, scaling errors Rx, Ry due to a linear expansion and contraction of the wafer, X- and Y-directional positional deviations of the wafer, viz., offset errors Ox, Oy. Then, the shot array coordinates in terms of design are transformed into actual shot array coordinates through an intermediary of those parameters; and a stepping position when exposed is obtained.

Now, in accordance with this embodiment, it is assumed that eight pieces of shot areas $S_1$–$S_8$ are prepared as sample alignment shot areas on the wafer W. Then, in the respective sample shot areas $S_{1-8}$, there are formed marks MXn, MYn (n is 1 through 8) in to which the alignment marks RMx, RMy shown in FIG. 2 are projection-exposed on the wafer W. Let RCn (n is 1 through 8) be the points of centers of the respective sample shot areas $S_1$–$S_8$. The main control system MCS drives the XY stage ST1 through the drive system 1 so that the off-axis alignment system (22, 23) detects the marks MXn, MYn of the above-mentioned eight samples shot areas $S_1$–$S_8$. The main control system MCS calculates stepping positions (Xn, Yn) of the respective sample shots at the exposure time on the basis of the alignment marks of the respective sample shots detected by the signal processor 102 and the baseline quantity of the alignment system (22, 23).

Now, the main control system MCS, before locating the stage ST in the stepping positions (Xn, Yn), causes the focus detection system illustrated in FIG. 1 to detect the focal point. The slit image SP at that time, as shown in FIG. 9, deviates by (ΔX, ΔY) in the X- and Y-directions from the point-of-center RC' of the shot area. These deviations ΔX, ΔY are obtained by the operations in steps 210 to 235 in the preceding sixth embodiment (FIG. 16). The main control system MCS, after adjusting the focal point of the slit image SP through the drive unit 18c, performs the focus detection by locating the stage ST in a position corresponding to coordinate values (Xn+ΔX, Yn+ΔY). The main control system MCS thus locates the wafer surface on the imaging plane of the projection optical system PL. Then, the stage ST is located in the stepping position (Xn, Yn), and the exposure takes place.

According to the above sequence, it is possible to detect the focal point by making the slit image SP fall on the point-of-center RC' of the shot area all the time. Further, if plane-parallel glass 16 shown in FIG. 1, is not present, i.e., even when the position of the slit image can not be adjusted, in accordance with this embodiment, the same effects as those in the preceding fourth and fifth embodiments are obtainable.

Now, in each of the fourth to seventh embodiments discussed above, the forming position of the slit image SP and the deviation of the focal point are detected by the area sensor 81. However, as explained in FIGS. 10A and 10B, it is possible to measure the forming position of the slit image SP and the deviation of the focal point by forming the fiducial mark having a rectangular shape with a low-reflectivity with respect to the surroundings on the fiducial plate FM and by relatively scanning said mark and the slit image SP. This operation will be briefly explained with reference to FIGS. 10A and 10B.

As shown in FIG. 10A, the fiducial mark 30a is a mark of a low reflection area made of, for example, quart's, or the like, and is formed within a high reflection area 30b with chromium coated thereon. This fiducial mark 30a is formed on the fiducial plate FM which is shown in FIG. 3. The main control system MCS makes the slit image SP fall on the fiducial mark 30a and, at the same time, shifts the wafer stage ST in the X direction so as to relatively scan the slit image SP and the fiducial mark 30a. FIG. 10A shows a situation of how the slit image SP performs scanning when the fiducial mark 30a is fixed, for reasons of convenience. FIG. 10B shows a level of a photoelectric signal which is obtained by the light-receiving unit 21. In this case, the level of the photoelectric signal when the slit image SP scans the surrounding area 30b is denoted by Sh, and the level of the photoelectric signal when the slit image SP scans the mark unit 30a by S1. Then, as shown in FIG. 10B, a point at which the level of the signal starts decreasing from Sh toward S1 is denoted by $A_1$, a point at which the level reaches S1 by $A_2$, a point at which the level starts increasing from S1 toward Sh by $A_3$, then a point at which the level for the second time reaches Sh by $A_4$. The photoelectric signal from the light receiving unit 21 is output to the signal processor 103.

The signal processor 103 measures the X-coordinate value Xsa corresponding to the mid-point between the point $A_1$ and the point $A_2$ and the X-coordinate value Xsb corresponding to the mid-point between the point $A_3$ and the point $A_4$, and calculates a center between the two X-coordinate values Xsa and Xsb as the X-coordinate value Xsc of the slit image SP. In the same way, the slit image SP and the fiducial mark 30a are relatively scanned in the Y direction so as to obtain the Y-coordinate value Ysp of the slit image SP. These coordinate signals are output to the main control system MCS. Then, the main control system MCS calculates a position (σx, σy) of the slit image in the XY-coordinate system on the basis of these coordinate signals.

Further, the signal processor 103 calculates the width of the slit image SP in accordance with an inclination of a straight line which connects the point $A_1$ to the point $A_2$, and an inclination of a straight line which connects the point $A_3$ to the point $A_4$. Then, the width of the slit image is calculated by varying the height position of the stage ST as explained in the previous fourth embodiment (the step 230 in FIG. 14), thereby obtaining the deviation quantity ΔZ of the slit image SP in the height direction.

As started above, the position and the focal point shift of the slit image SP can be detected on the basis of a change of a photoelectric signal from the light-receiving unit 21 when the slit image SP is relatively scanned in two areas each having different reflectivity. Moreover, an algorithm for calculating the XY-coordinate value of the slit image SP is not limited to that in the foregoing embodiment. Also, the slit image SP may be scanned with respect to the fiducial mark by driving the plane-parallel glass 16. In this case, the main control system MCS aligns the point-of-center of the fiducial mark with the optical axis AX or with the projection position of the point-of-center of the reticle R. Then, an angle of rotation of the plane-parallel glass when the point-of-center of the slit image passes through the point-of-center of the fiducial mark is measured. Thereafter, if aligned with this angle, the slit image can be formed on the optical axis AX or in the projection position of the point-of-center of the reticle R.

Further, in the fourth to seventh embodiments, the slit image SP, the reticle R or the wafer W is moved in such a manner that the slit image SP is formed in the point-of-center of each shot area when the focal point is detected. However, it is not necessarily required to form the slit image SP in the point-of-center RC' of each shot area. For example, the main control system MCS is required to memorize beforehand the data concerning the height positions (ruggedness) in an arbitrary location within each shot area, and to correct a result of detection by the focus detection system in accordance with a deviation quantity between the height position of the point-of-center RC' and the height position at the point at which the slit image is formed. Thus, the focal point can be detected at an arbitrary location within the shot area.

Moreover, the slit image SP may be projected not at the point-of-center RC' of the shot area but on an area in the same height position as the point-of-center RC'. At this time also, as in the same way as the above-mentioned, the main control system MCS is required to memorize beforehand the data about the height positions (ruggedness) in an arbitrary location within each shot area. Besides, the focus detection system is arranged to detect the focal point at the point-of-center RC' of the shot area. However, the focus detecting position is not limited to the point-of-center of the shot area, but may be set in any position within the shot area.

Moreover, the area sensor 81 in the above embodiment is arranged on the wafer stage ST (the Z stage ST2). However, it may be such arranged that the slit image be guided by an optical fiber or a mirror to the light-receiving plane of the area sensor which is disposed inside or outside the wafer stage ST. Further, an enlarging optical system may be provided for enlarging the slit image SP, and the slit image thus enlarged may be formed on the light-receiving plane of the area sensor. At this time, the area sensor may be disposed inside or outside the wafer stage ST. It may be such arranged, if needed, such that the slit image is guided onto the light receiving plane of the area sensor by use of an optical fiber, or the like.

It is apparent that, in this invention, a wide range of different working modes can be formed based on the invention without deviating from the spirit and scope of the invention. This invention is not restricted by its specific working modes except being limited by the appended claims.

What is claimed is:

1. A projection exposure apparatus comprising:

a projection optical system for projecting a pattern of a mask on a photosensitive substrate;

a stage, for holding the photosensitive substrate, movable in an optical-axis direction of said projection optical system and in a predetermined direction perpendicular to the optical axis;

a position detection system for outputting a detection signal, corresponding to a deviation between an imaging plane of said projection optical system and a surface of the photosensitive substrate in said optical-axis direction, by projecting a light beam having a predetermined shape on the photosensitive substrate and, at the same time, photoelectrically detecting light reflected from the photosensitive substrate;

a fiducial member provided on said stage and having a fiducial pattern assuming a predetermined shape;

a memorizing device for memorizing positional information regarding said fiducial pattern; and a device for detecting an irradiation position of said light beam within a plane perpendicular to the optical axis of said projection optical system based on variations in intensity of a detection signal outputted from said position detection system when the fiducial pattern and the light beam are relatively moved in the predetermined direction perpendicular to the optical axis of said projection optical system, and based on the positional information memorized in said memorizing device.

2. An apparatus according to claim 1, wherein said position detection system has an optical member for shifting the irradiation position of the light beam within the plane perpendicular to the optical axis of said projection optical system, and further comprising:

a member for driving said optical member based on the detected irradiation position so that the light beam is projected on a predetermined position within the plane perpendicular to the optical axis of said projection optical system.

3. An apparatus according to claim 1, wherein the fiducial pattern has at least two areas disposed substantially along the predetermined direction and exhibiting reflectivities different from each other.

4. An apparatus according to claim 1, further comprising:

a device for displaying at least one of a relative positional relationship between a predetermined position on which the light beam is to be projected and the detected irradiation position and whether a relative positional deviation between the predetermined position and the detected irradiation position falls within a predetermined allowable range.

5. An apparatus according to claim 1, wherein a predetermined position on which the light beam is to be projected is a projection position of a predetermined fiducial point within the pattern of the mask, and further comprising:

a mark detection system for photoelectrically detecting a positional relationship between a first mark formed at the fiducial point or a predetermined point having a predetermined positional relationship with the fiducial point and a second mark provided on said stage; and a measuring device for obtaining a projection position of the fiducial point within the plane perpendicular to the optical axis of said projection optical system based on output from said mark detection system.

6. An apparatus according to claim 5, wherein the second mark is the fiducial pattern on said fiducial member.

7. An apparatus according to claim 5, wherein the second mark is a mark disposed separately from the fiducial pattern but in a predetermined positional relationship therewith.

8. A projection exposure apparatus comprising:

a projection optical system for projecting a pattern of a mask on a photosensitive substrate;

a stage, for holding the photosensitive substrate, movable in an optical-axis direction of said projection optical system and in a predetermined direction perpendicular to the optical axis;

a position detection system for outputting a detection signal, corresponding to a deviation between an imaging plane of said projection optical system and a surface of the photosensitive substrate in said optical-axis direction, by projecting a light beam having a predetermined shape on the photosensitive substrate and, at the same time, photoelectrically detecting light reflected from the photosensitive substrate;

a device for driving said stage in the optical-axis direction of said projection optical system based on the detection signal outputted from said position detection system;

a fiducial member provided on said stage and having a fiducial pattern assuming a predetermined shape;

a memorizing device for memorizing positional information regarding said fiducial pattern; and a device for controlling a movement of said stage through said driving device in accordance with the detection signal outputted from said position detection system when the fiducial pattern and the light beam are relatively moved in the predetermined direction perpendicular to the optical axis of said projection optical system, and based on the positional information memorized in said memorizing device.

9. A projection exposure apparatus comprising:

a projection optical system for projecting a pattern of a mask on a photosensitive substrate;

a stage, for holding the photosensitive substrate, movable in an optical-axis direction of said projection optical system and in a predetermined direction perpendicular to the optical axis;

a position detection system including a light projecting system for projecting a light beam having a predetermined shape onto said photosensitive substrate and shifting a position irradiated by said light beam within a plane perpendicular to the optical axis of said projection optical system, and a light receiving system for photoelectrically detecting light reflected from said photosensitive substrate, said position detection system outputting a detection signal corresponding to a deviation between an imaging plane of said projection optical system and a surface of the photosensitive substrate in said optical-axis direction;

a fiducial member provided on said stage and having a fiducial pattern assuming a predetermined shape;

a device for detecting an irradiation position of the light beam within a plane perpendicular to the optical axis of said projection optical system based on variations in intensity of a detection signal outputted from said position detection system when the fiducial pattern and the light beam are relatively moved in the predetermined direction perpendicular to the optical axis of said projection optical system; and a driving device for driving said light projecting system to shift the irradiation position of the light beam based on the detected irradiation position.

10. An apparatus according to claim 9, wherein the fiducial pattern has at least two areas disposed substantially along the predetermined direction and exhibiting reflectivities different from each other.

11. An apparatus according to claim 9, further comprising:

a device for displaying at least one of a relative positional relationship between a predetermined position on which the light beam is to be projected and the detected irradiation position and whether a relative positional deviation between the predetermined position and the detected irradiation position falls within a predetermined allowable range.

12. An apparatus according to claim 9, wherein a predetermined position on which the light beam is to be projected is a projection position of a predetermined fiducial point within the pattern of the mask, and further comprising:

a mark detection system for photoelectrically detecting a positional relationship between a first mark formed at the fiducial point or a predetermined point having a predetermined positional relationship with the fiducial point and a second mark provided on said stage; and a measuring device for obtaining a projection position of the fiducial point within the plane perpendicular to the optical axis of said projection optical system based on output from said mark detection system.

13. A projection exposure method of exposing a photosensitive substrate with a pattern on a mask through a projection optical system, comprising the steps of:

projecting a pattern image onto said photosensitive substrate with a light projecting system, and photoelectrically detecting light reflected from said photosensitive substrate with a light receiving system, and outputting a detection signal corresponding to a deviation between an imagine plane of said projection optical system and a surface of said photosensitive substrate, said deviation being along the optical axis of said projection optical system; and adjusting a focal point of said pattern image on said photosensitive substrate based on said detection signal.

14. A method according to claim 13, further comprising the steps of:

detecting a position of said pattern image in a plane perpendicular to the optical axis of said projection optical system; and moving said pattern image on the basis of said detected position.

15. An exposing method of exposing a pattern of a mask onto a photosensitive substrate through a projection optical system, comprising the steps of:

projecting a light beam having a predetermined shape onto said photosensitive substrate, opto-electrically detecting light reflected from said photosensitive substrate, and outputting a detection signal corresponding to a deviation between an imaging plane of said projection optical system and a surface of said photosensitive substrate, said deviation being along the optical axis of said projection optical system;

memorizing positional information regarding a fiducial pattern provided on a stage; and detecting a position irradiated by said light beam within a plane perpendicular to the optical axis of said projection optical system, in accordance with variations of an intensity of said detection signal when said fiducial pattern and said light beam are relatively moved along a predetermined direction perpendicular to the optical axis of said projection optical system based on the memorized positional information.

16. A projection exposure apparatus comprising:

a projection optical system for projecting a pattern of a mask on a photosensitive substrate;

a stage, for holding the photosensitive substrate, movable in an optical-axis direction of said projection optical system and in a direction perpendicular to the optical axis;

a focus detection system including a light projecting system for projecting a pattern image onto said photosensitive substrate, and a light receiving system for photoelectrically detecting light reflected from said photosensitive substrate, said focus detection system outputting a detection signal corresponding to a deviation between an imaging plane of said projection optical system and a surface of the photosensitive substrate in the optical-axis direction of said projection optical system;

a pattern light receiving system having a light receiving plane provided on said stage, for photoelectrically detecting said pattern image;

a detection system for detecting an imaging status of said pattern image based on a photoelectric signal output from said pattern light receiving system when said pattern image is projected on said light receiving plane; and a driving member for driving at least one of a plurality of optical elements constituting said light projecting system, along an optical-axis direction of said light projecting system, based on the detected imaging status.

17. A projection exposure apparatus comprising:

a projection optical system for projecting a pattern of a mask on a photosensitive substrate;

a position detection system for projecting a pattern image on said photosensitive substrate and photoelectrically detecting light reflected from said photosensitive substrate so as to detect a position or a positional deviation of said photosensitive substrate in an optical-axis direction of said projection optical system; and an adjustment device for driving at least one optical element of said position detection system, and adjusting at least one of an imaging status of said pattern image and a position of said pattern image in a plane perpendicular to the optical axis of said projection optical system.

18. An apparatus according to claim 16, wherein said pattern light receiving system comprises an image pick-up element for picking up said pattern image.

19. An apparatus according to claim 16, further comprising:

a position detection system for detecting a forming position at which said pattern image is formed on a plane perpendicular to said optical axis based on a photoelectric signal from said pattern light receiving system; and a moving device for moving said pattern image in accordance with said detected forming position in such a manner that said pattern image is set at a predetermined position.

20. An apparatus according to claim 19, wherein said moving device comprises a drive member for driving an optical member provided in said focus detection system for shifting said pattern image in the plane perpendicular to said optical axis.

21. A projection exposure apparatus comprising:

a projection optical system for projecting a pattern of a mask on a photosensitive substrate;

a stage, for holding the photosensitive substrate, movable in an optical-axis direction of said projection optical system and in a direction perpendicular to the optical axis;

a focus detection system for outputting a detection signal corresponding to a deviation between an imaging plane of said projection optical system and a surface of the photosensitive substrate in the optical-axis direction of said projection optical system, by projecting a pattern image on said photosensitive substrate and photoelectrically detecting light reflected from said photosensitive substrate;

a reflection member provided on said stage and having at least two areas of different reflectivity;

a memorizing device for memorizing positional information regarding said reflection member;

a detection system for relatively scanning said pattern image and said reflection member based on the positional information memorized in said memorizing device, and detecting an imaging status of said pattern image based on a photoelectric signal output from said focus detection system caused by said scanning; and an adjustment device for adjusting a focal point of said pattern image on said photosensitive substrate based on said detected imaging status.

22. An apparatus according to claim 21, wherein said focus detection system comprises a projection system for projecting said pattern image on said substrate, and said adjustment device comprises a drive member for driving at least one of a plurality of optical elements constituting said projection system along an optical-axis direction of said projection system.

23. An apparatus according to claim 21, further comprising:

a position detection system for detecting a forming position at which said pattern image is formed on a plane perpendicular to said optical axis based on a change in the intensity of a detection signal from said focus detection system; and a moving device for moving said pattern image in accordance with said detected forming position in such a manner that said pattern image is set at a predetermined position.

24. An apparatus according to claim 23, wherein said moving device comprises a drive member for driving an optical member provided in said focus detection system for shifting the position of said pattern image in the plane perpendicular to said optical axis.

*25. An exposing method of exposing a pattern of a mask onto a substrate through a projection system, comprising the steps of:*

*projecting a light beam onto said substrate to detect a deviation between an imaging plane of said projection system and a surface of said substrate; and*

*detecting a position irradiated by said light beam within a plane perpendicular to an optical axis of said projection system.*

*26. A projection exposure apparatus comprising:*

*a projection system for projecting a pattern of a mask on a substrate;*

*a position detection system for outputting a detection signal, corresponding to a deviation between an imaging plane of said projection system and a surface of the substrate, by projecting a light beam on the substrate; and*

*a device for detecting an irradiation position of said light beam within a plane perpendicular to an optical axis of said projection system.*

*27. An exposure apparatus for exposing a substrate, comprising:*

*a first detection system which radiates a light beam onto said substrate and detects substrate position information with respect to a predetermined first direction, at a portion irradiated with said light beam; and*

*a second detection system which detects irradiation position information of said light beam in a plane which is substantially perpendicular to said first direction.*

*28. An exposure apparatus according to claim 27, further comprising a projection system which projects an image of a pattern formed by radiation of an exposure beam, onto said substrate, wherein said first direction is substantially parallel to a direction of an optical axis of said projection system.*

*29. An exposure apparatus according to claim 28, wherein said first detection system has an optical axis inclined with respect to the optical axis of said projection system and includes a light projector which projects said light beam onto said substrate and a light receiver which receives reflection light of said light beam from said substrate, and wherein said exposure apparatus further comprises a control system which effects focusing by moving an image plane of said projection system and said substrate relatively based on a detection result of said first detection system.*

*30. An exposure apparatus according to claim 27, further comprising a correction device which effects a correction of a detection condition of said substrate position information in said first detection system, based on a detection result of said second detection system.*

*31. An exposure apparatus according to claim 30, wherein said correction of the detection condition includes an adjustment of the irradiation position of said light beam.*

*32. An exposure apparatus according to claim 31, wherein said adjustment includes adjusting the irradiation position of said light beam to a predetermined fiducial position within the plane which is substantially perpendicular.*

*33. An exposure apparatus according to claim 30, wherein said correction device corrects, upon detection of the substrate position information with respect to said first direction, a position of said substrate within said plane such that a predetermined position within a shot area formed on said substrate is irradiated with said light beam.*

*34. An exposure apparatus according to claim 30, wherein said correction device has a memory portion which memorizes information on ruggedness on said substrate so that the correction device corrects the detection condition by said first detection system in accordance with a detection result of said second detection system and said information on ruggedness.*

*35. An exposure apparatus according to claim 34, wherein said detection condition correction includes a correction of a detection result of said first detection system.*

*36. An exposure apparatus according to claim 32, further comprising a mask position detection system which detects a position within a plane perpendicular to the optical axis of said projection system, of a mask formed with a pattern, wherein said correction device effects the correction of a detection condition in said first detection system based on a detection result of said second detection system and a detection result of said mask position detection system.*

*37. An exposure apparatus according to claim 36, wherein said correction of a detection condition includes adjustment of the position of said mask.*

*38. An exposure apparatus according to claim 27, wherein said first detection system irradiates said substrate with a plurality of light beams to detect the substrate position information with respect to a plurality of points on said substrate, and said second detection system detects said irradiation position information with respect to each of said plurality of light beams.*

*39. An exposure apparatus according to claim 27, further comprising a display portion which displays a detection result of said second detection system.*

*40. An exposure apparatus according to claim 27, wherein said second detection system is disposed on a stage on which said substrate is placed and has a fiducial member having a fiducial pattern with a predetermined shape so as to detect the light beam irradiation position information by relatively scanning said fiducial pattern and said light beam.*

*41. An exposure for exposing a substrate, comprising:*

*radiating a light beam onto the substrate and detecting substrate position information with respect to a predetermined first direction, at a portion on said substrate irradiated with said light beam; and*

*detecting irradiation position information of said light beam in a plane which is substantially perpendicular to said first direction.*

*42. An exposure method according to claim 41, wherein said first direction is substantially parallel to a direction of an optical axis of a projection optical system that projects an image of a pattern formed by radiation of an exposure beam.*

*43. An exposure method according to claim 42, further comprising moving an image plane of said projection system and said substrate relatively based on said substrate position information with respect to the first direction to effect focusing.*

*44. An exposure method according to claim 41, further comprising effecting a correction of a detection condition of said substrate position information with respect to the first direction, based on said irradiation position information.*

*45. An exposure method according to claim 44, wherein said correction of the detection condition includes an adjustment of the irradiation position of said light beam.*

*46. An exposure method according to claim 45, wherein said adjustment includes adjusting the irradiation position of said light beam to a predetermined fiducial position within the plane which is substantially perpendicular to said first direction.*

*47. An exposure method according to claim 44, wherein said correction includes correcting, upon detection of the substrate position information with respect to said first direction, a position of said substrate within said plane such that a predetermined position within a shot area formed on said substrate is irradiated with said light beam.*

*48. An exposure method according to claim 44, wherein said correction includes correcting the detection condition in accordance with said irradiation position information and information on ruggedness on said substrate.*

*49. An exposure method according to claim 48, wherein said detection condition correcting includes a correction of said substrate position information with respect to the first direction.*

*50. An exposure method according to claim 44, further comprising detecting position information within a plane perpendicular to the optical axis of said projection system, of a mask formed with a pattern, wherein said correction comprises correcting the detection condition based on said irradiation position information and said mask position information.*

*51. An exposure method according to claim 50, wherein said correcting of the detection condition includes an adjustment of the position of said mask.*

*52. An exposure method according to claim 41, wherein said detecting the substrate position information with respect to the first direction comprises irradiating said substrate with a plurality of light beams to detect the substrate position information with respect to a plurality of points on said substrate, and said detecting the irradiation position information comprises detecting said irradiation position information with respect to each of said plurality of light beams.*

*53. An exposure method according to claim 41, further comprising displaying said irradiation position information.*

*54. An exposure method according to claim 41, wherein said detecting the irradiation position information comprises detecting the irradiation position information of the light beam by relatively scanning said light beam and a fiducial pattern having a predetermined shape formed on a stage on which said substrate is placed.*

*55. A method of manufacturing an exposure apparatus for exposing a substrate, comprising:*

*providing a first detection system which radiates a light beam onto said substrate and detects substrate position information with respect to a predetermined first direction, at a portion irradiated with said light beam; and*

*providing a second detection system which detects irradiation position information of said light beam in a plane which is substantially perpendicular to said first direction.*

*56. A method according to claim 55, further comprising providing a projection system which projects an image of a pattern formed by radiation of an exposure beam, onto said substrate, wherein said first direction is substantially parallel to a direction of an optical axis of said projection system.*

*57. A method according to claim 56, wherein said first detection system has an optical axis inclined with respect to the optical axis of said projection system and includes a light projector which projects said light beam onto said substrate and a light receiver which receives reflection light of said light beam from said substrate, and wherein said method further comprises providing a control system which effects focusing by moving an image plane of said projection system and said substrate relatively based on a detection result of said first detection system.*

*58. A method according to claim 55, further comprising providing a correction device which effects a correction of a detection condition of said substrate position information in said first detection system, based on a detection result of said second detection system.*

*59. A method according to claim 58, wherein said correction of the detection condition includes an adjustment of the irradiation position of said light beam.*

*60. A method according to claim 59, wherein said adjustment includes adjusting the irradiation position of said light beam to a predetermined fiducial position within the plane which is substantially perpendicular to said first direction.*

*61. A method according to claim 58, wherein said correction device corrects, upon detection of the substrate position information with respect to said first direction, a position of said substrate within said plane such that a predetermined position within a sot area formed on said substrate is irradiated with said light beam.*

*62. A method according to claim 58, wherein said correction device has a memory portion which memorizes information on ruggedness on said substrate so that the correction device corrects the detection condition by said first detection system in accordance with a detection result of said second detection system and said information on ruggedness.*

*63. A method according to claim 58, wherein said detection condition correction includes a correction of a detection result of said first detection system.*

*64. A method according to claim 58, further comprising providing a mask position detection system which detects a position within a plane perpendicular to the optical axis of said projection system, of a mask formed with a pattern, wherein said correction device effects the correction of the detection condition in said first detection system based on a detection result of said second detection system and a detection result of said mask position detection system.*

*65. A method according to claim 64, wherein said correction of the detection condition includes adjustment of the position of said mask.*

*66. A method according to claim 55, wherein said first detection system irradiates said substrate with a plurality of light beams to detect the substrate position information with respect to a plurality of points on said substrate, and said second detection system detects said irradiation position information with respect to each of said plurality of light beams.*

*67. A method according to claim 55, further comprising providing a display portion which displays a detection result of said second detection system.*

*68. A method according to claim 55, wherein said second detection system is disposed on a stage on which said substrate is placed and has a fiducial member having a fiducial pattern with a predetermined shape so as to detect the light beam irradiation position information by relatively scanning said fiducial pattern and said light beam.*

* * * * *